US010032839B2

(12) United States Patent
Kang et al.

(10) Patent No.: US 10,032,839 B2
(45) Date of Patent: Jul. 24, 2018

(54) DISPLAY DEVICE

(71) Applicant: Samsung Display Co., Ltd., Yongin-si, Gyeonggi-do (KR)

(72) Inventors: Ki Nyeng Kang, Seoul (KR); Jong Hyun Choi, Seoul (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 51 days.

(21) Appl. No.: 15/159,592

(22) Filed: May 19, 2016

(65) Prior Publication Data
US 2017/0025070 A1    Jan. 26, 2017

(30) Foreign Application Priority Data
Jul. 22, 2015 (KR) .................. 10-2015-0103715

(51) Int. Cl.
*G09G 3/3275* (2016.01)
*H01L 27/32* (2006.01)
*G09G 3/3266* (2016.01)
*G09G 3/3233* (2016.01)

(52) U.S. Cl.
CPC ....... *H01L 27/3248* (2013.01); *G09G 3/3233* (2013.01); *G09G 3/3266* (2013.01); *H01L 27/3276* (2013.01); *G09G 2300/0408* (2013.01); *G09G 2300/0426* (2013.01); *G09G 2300/0842* (2013.01); *G09G 2310/0281* (2013.01)

(58) Field of Classification Search
CPC ............ H01L 27/3276; H01L 27/3248; G09G 3/3266
See application file for complete search history.

(56) References Cited

U.S. PATENT DOCUMENTS

| 9,798,339 | B2* | 10/2017 | Tanaka | G02F 1/1368 |
| 2006/0146211 | A1* | 7/2006 | Deane | G02F 1/1345 349/42 |
| 2007/0035485 | A1* | 2/2007 | Yoon | G09G 3/3208 345/76 |
| 2009/0051636 | A1 | 2/2009 | Natori | |

(Continued)

FOREIGN PATENT DOCUMENTS

CN    203519983 U    4/2014
EP    2 669 884 A2    12/2013

(Continued)

OTHER PUBLICATIONS

Yoshida et al., "49.1: Flexible Flat-Panel Display Designs with Gate Driver Circuits Integrated within the Pixel Area," *SID International Symposium, Digest of Technical Papers*, vol. 45, No. 1, Jun. 2014, pp. 701-704.

(Continued)

*Primary Examiner* — Abbas Abdulselam
(74) *Attorney, Agent, or Firm* — Knobbe Martens Olson & Bear LLP

(57) ABSTRACT

A display device is disclosed. In one aspect, the display device includes a display area including a plurality of pixel circuits arranged in a first direction and a second direction crossing the first direction. The display device also includes a plurality of gate lines extending in the first direction and electrically connected to the pixel circuits, and a gate driver electrically connected to the gate lines and disposed in the display area.

27 Claims, 20 Drawing Sheets

(56) References Cited

U.S. PATENT DOCUMENTS

| | | | |
|---|---|---|---|
| 2014/0049453 A1* | 2/2014 | Lee | G09G 3/20 |
| | | | 345/55 |
| 2015/0014650 A1 | 1/2015 | Lim et al. | |
| 2016/0019856 A1 | 1/2016 | Tanaka et al. | |
| 2016/0041443 A1* | 2/2016 | Wu | G02F 1/136286 |
| | | | 349/43 |

FOREIGN PATENT DOCUMENTS

| | | |
|---|---|---|
| EP | 2 902 994 A1 | 8/2015 |
| KR | 10-2012-0042437 A | 5/2012 |
| KR | 10-2014-0077414 A | 6/2014 |
| WO | WO 2014/069529 A1 | 5/2014 |
| WO | WO 2014/142183 A1 | 9/2014 |

OTHER PUBLICATIONS

Partial European Search Report dated Mar. 23, 2017 for European Patent Application No. EP 16 18 0235.0 which corresponds to subject U.S. Appl. No. 15/159,592 and cites the above—identified references No. 1-9.

Extended European Search Report (EESR) dated Jul. 3, 2017 for European Patent Application No. EP 16 180 235.0 which shares priority of Korean Patent Application No. KR 10-2015-0103715 with subject U.S. Appl. No, 15/159,592. The EESR cites references previously made of record in the subject application.

* cited by examiner

DISPLAY DEVICE

CROSS-REFERENCE TO RELATED APPLICATION

This application claims priority to and the benefit of Korean Patent Application No. 10-2015-0103715 filed in the Korean Intellectual Property Office on Jul. 22, 2015, the entire contents of which are incorporated herein by reference.

BACKGROUND

Field

The described technology generally relates to display devices.

Description of the Related Technology

Liquid crystal displays (LCDs), field emission displays, plasma display panels (PDPs), and organic light-emitting diode (OLED) displays are in wide use.

Generally, a display device includes a matrix of pixels, gate lines extending in a row direction and data lines extending in a column direction. The pixels are driven by gate signals transmitted through the gate lines and data signals transmitted through the data lines.

Recently, free-shape display devices, in which the display units have various shapes other than quadrangular shapes (e.g., circular or polygonal), have been developed. When gate lines and data lines applied to a typical matrix form of pixels are used in display devices, a bezel at the outside of the display unit is unnecessarily widened. It thus can be more difficult to design the display unit in various shapes.

The above information disclosed in this Background section is only to enhance the understanding of the background of the disclosure and therefore it can contain information that does not form the prior art that is already known in this country to a person of ordinary skill in the art.

SUMMARY OF CERTAIN INVENTIVE ASPECTS

One inventive aspect relates to a display device that can reduce an unnecessary bezel and design limit for a display unit in a free shape display device including the display unit to be able to have various shapes.

Another aspect is a display device including: a display area including a plurality of pixel circuits that are arranged in a first direction and a second direction; a plurality of gate lines extending in the first direction to be connected to the plurality of pixel circuits; and a gate driver that is connected to the plurality of gate lines and is disposed in the display area.

The display device can further include a plurality of data lines that extend to gradually depart from each other in the display area to be connected to the plurality of pixel circuits.

The gate driver can include a plurality of gate driving circuits disposed in the display area.

The gate driving circuits can be disposed in areas that do not overlap with the plurality of pixel circuits in at least one of the first direction and the second direction in the display area.

The display device can further include a plurality of organic light emitting diodes corresponding to the plurality of pixel circuits.

The plurality of pixel circuits can be spaced apart from each other, and the plurality of organic light emitting diodes can be disposed to be adjacent to each other at a narrower interval than that between the pixel circuits.

A clock wire and a power wire for driving the plurality of gate driving circuits can be disposed between the pixel circuits.

The display device can further include: a plurality of emission signal lines extending in the first direction to be connected to the plurality of pixel circuits; and an emission driver that is connected to the plurality of emission signal lines and is disposed in the display area.

The emission driver can include a plurality of emission driving circuits disposed in the display area.

The emission driving circuit can be disposed in areas that do not overlap with the plurality of pixel circuits in at least one of the first direction and the second direction in the display area.

A clock wire and a power wire for driving the plurality of emission driving circuits can be disposed between the pixel circuits.

The plurality of pixel circuits can be divided into a plurality of dot circuit portions including adjacent pixel circuits, the plurality of dot circuit portions can be spaced apart from each other, and the plurality of organic light emitting diodes can be disposed to be adjacent to each other in a narrower interval than that between the dot circuit portions.

The pixel circuits forming the dot circuit portions can be disposed in a stripe shape or a honeycomb shape.

The display device can further include a plurality of data lines that extend to gradually depart from each other in the display area to be connected to the plurality of pixel circuits, wherein the number of pixel circuits of each row arranged in the first direction can be changed depending on the second direction.

The number of pixel circuits of each column arranged in the second direction can be changed depending on the first direction.

The number of the plurality of data lines can be equal to or greater than one of the maximum number of pixel circuits arranged in the first direction and the maximum number of pixel circuits arranged in the second direction.

Each of the plurality of pixel circuits can include: a driving transistor disposed on a substrate; a first organic layer disposed on the driving transistor; a second organic layer disposed on the first organic layer; and an organic light emitting diode connected to the driving transistor through a contact hole formed in the first organic layer and the second organic layer, wherein the plurality of data lines are disposed between the first organic layer and the second organic layer.

Another aspect is a display device including: a display area including a plurality of pixels that are arranged in a first direction and a second direction; a plurality of gate lines extending in the first direction to be connected to the plurality of pixels; and a plurality of data lines that extend to gradually depart from each other in the display area to be connected to the plurality of pixels.

The number of pixels of each row arranged in the first direction can be changed depending on the second direction.

The number of the plurality of data lines can be equal to or greater than one of the maximum number of pixels arranged in the first direction and the maximum number of pixels arranged in the second direction.

The plurality of pixels can include a plurality of organic light emitting diodes and a plurality of pixel circuits for driving the plurality of organic light emitting diodes.

Each of the plurality of pixel circuits can include: a driving transistor disposed on a substrate; a first organic layer disposed on the driving transistor; and a second organic layer disposed on the first organic layer, wherein the organic light emitting diode can be connected to the driving transistor through a contact hole formed in the first organic layer and the second organic layer, and the plurality of data lines can be disposed between the first organic layer and the second organic layer.

The display device can further include a plurality of gate driving circuits connected to ends of the plurality of gate lines.

The display device can further include: a plurality of emission signal lines that extend in the first direction to be connected to the plurality of pixels; and a plurality of emission driving circuits connected to ends the plurality of emission signal lines.

The display device can further include: a plurality of gate-connecting lines connected to the plurality of gate lines; and a plurality of gate driving circuits that are disposed at one side of the display area to be connected to the plurality of gate-connecting lines.

The display device can further include: a plurality of emission signal lines that extend in the first direction to be connected to the plurality of pixels; a plurality of emission-connecting lines connected to the plurality of emission signal lines; and a plurality of emission driving circuits that are disposed at one side of the display area to be connected to the plurality of emission-connecting lines.

Another aspect is a display device comprising: a display area including a plurality of pixel circuits arranged in a first direction and a second direction crossing the first direction; a plurality of gate lines extending in the first direction and electrically connected to the pixel circuits; and a gate driver electrically connected to the gate lines and disposed in the display area.

The above display device further comprises a data driver connected to the gate driver and a plurality of data lines connected to the pixel circuits and radially extending from the data driver.

In the above display device, the gate driver includes a plurality of gate driving circuits disposed in the display area.

In the above display device, the gate driving circuits are disposed in areas that do not overlap the pixel circuits in at least one of the first and second directions in the display area.

The above display device further comprises a plurality of organic light-emitting diodes (OLEDs), wherein the pixel circuits are configured to respectively drive the OLEDs.

In the above display device, the pixel circuits are spaced apart from each other, wherein the OLEDs are disposed adjacent to each other at a narrower interval than that between the pixel circuits.

The above display device further comprises a clock wire and a power wire configured to drive the gate driving circuits, wherein the clock and power wires are disposed between the pixel circuits.

The above display device further comprises: a plurality of emission signal lines extending in the first direction and connected to the pixel circuits; and an emission driver electrically connected to the emission signal lines and disposed in the display area.

In the above display device, the emission driver includes a plurality of emission driving circuits disposed in the display area.

In the above display device, the emission driving circuits are disposed in areas that do not overlap the pixel circuits in at least one of the first and second directions in the display area.

The above display device further comprises a clock wire and a power wire configured to drive the emission driving circuits, wherein the clock and power wires are disposed between the pixel circuits.

In the above display device, the pixel circuits are divided into a plurality of dot circuits including adjacent pixel circuits, wherein the dot circuits are spaced apart from each other, and wherein the OLEDs are disposed adjacent to each other in a narrower interval than that between the dot circuits.

In the above display device, the pixel circuits of the dot circuit portions are disposed in a stripe shape or a honeycomb shape.

The above display device further comprises a data driver connected to the gate driver and a plurality of data lines connected to the pixel circuits and radially extending from the data driver, wherein the number of the pixel circuits in each row extending in the first direction is different from an adjacent row.

In the above display device, the number of the pixel circuits of each column arranged in the second direction is different from that of an adjacent column.

In the above display device, the number of the data lines is equal to or greater than one of the maximum number of the pixel circuits arranged in the first direction and the maximum number of the pixel circuits arranged in the second direction.

In the above display device, each of the pixel circuits includes: a driving transistor disposed over a substrate; a first organic layer disposed over the driving transistor; a second organic layer disposed over the first organic layer, wherein the first and second organic layers have a contact hole formed therethrough; and an OLED connected to the driving transistor through the contact hole, wherein the data lines are disposed between the first and second organic layers.

Another aspect is a display device comprising: a display area including a plurality of pixels arranged in a first direction and a second direction crossing the first direction; a plurality of gate lines extending in the first direction and electrically connected to the pixels; and a data driver connected to the gate driver; a plurality of data lines connected to the pixels and radially extending from the data driver.

In the above display device, the number of the pixels of each row arranged in the first direction is different from that of adjacent row.

In the above display device, the number of the data lines is equal to or greater than one of the maximum number of the pixels arranged in the first direction and the maximum number of the pixels arranged in the second direction.

In the above display device, the pixels include: a plurality of organic light-emitting diodes (OLEDs); and a plurality of pixel circuits configured to respectively drive the OLEDs.

In the above display device, each of the pixel circuits includes: a driving transistor disposed over a substrate; a first organic layer disposed over the driving transistor; and a second organic layer disposed over the first organic layer, wherein the first and second organic layers have a contact hole formed therethrough, wherein the each OLED is respectively connected to the driving transistor through the contact hole, and wherein the data lines are disposed between the first and second organic layers.

The above display device further comprises a plurality of gate driving circuits electrically connected to opposing ends of the gate lines.

The above display device further comprises: a plurality of emission signal lines extending in the first direction and electrically connected to the pixels; and a plurality of emission driving circuits electrically connected to opposing ends of the emission signal lines.

The above display device further comprises: a plurality of gate-connecting lines electrically connected to the gate lines; and a plurality of gate driving circuits disposed at one side of the display area and electrically connected to the gate-connecting lines.

The above display device further comprises: a plurality of emission signal lines extending in the first direction and electrically connected to the pixels; a plurality of emission-connecting lines electrically connected to the emission signal lines; and a plurality of emission driving circuits disposed at one side of the display area and electrically connected to the emission-connecting lines.

Another aspect is a display device comprising: a display area including a plurality of first pixel circuits arranged in a first direction and a plurality of second pixel circuits arranged in a second direction crossing the first direction; a plurality of gate lines extending in the first direction and electrically connected to the first and second pixel circuits; a gate driver electrically connected to the gate lines and disposed in the display area; and a data driver formed in a non-display area adjacent to the display area; and a plurality of data lines radially extending from the data driver and electrically connected to the first and second pixel circuits.

In the above display device, the display area including the gate driver, the first and second pixel circuits, gate lines and data lines is symmetrical with respect to a center line of the display area.

In the above display device, the display area has a non-quadrangular shape.

In the above display device, the gate driver overlaps the display area in a plan view.

According to at least one of the disclosed embodiments, it is possible to reduce an unnecessary bezel and a design limit for a display unit in a free shape display device including the display unit to be able to have various shapes by radially disposing data lines and by disposing a gate driving circuit and an emission driving circuit in a display area.

DETAILED DESCRIPTION OF CERTAIN INVENTIVE EMBODIMENTS

Figure 1:
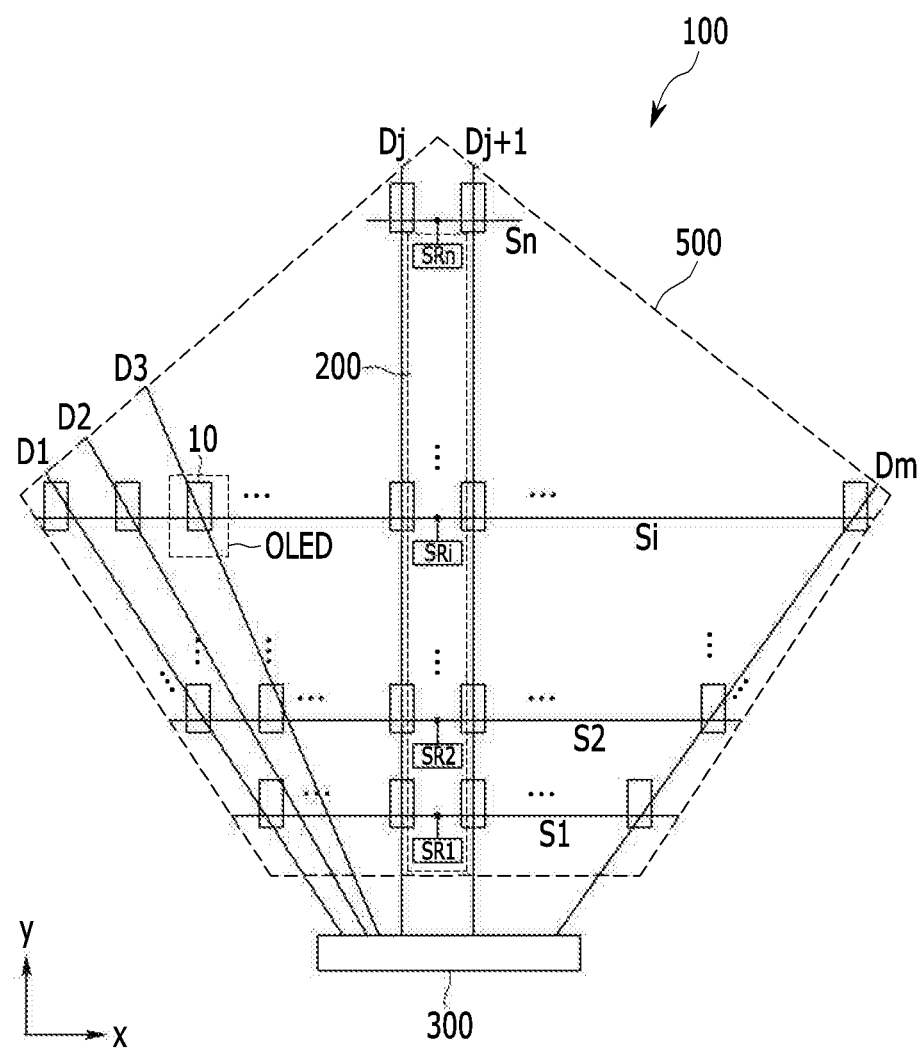
FIG. 1 illustrates a block diagram of a display device according to an exemplary embodiment of the present disclosure.

The present disclosure will be described more fully hereinafter with reference to the accompanying drawings, in which exemplary embodiments of the disclosure are shown. As those skilled in the art would realize, the described embodiments can be modified in various different ways, all without departing from the spirit or scope of the present disclosure.

Furthermore, with exemplary embodiments of the present disclosure, detailed description is made with respect to the constituent elements in a first exemplary embodiment with reference to the relevant drawings by using the same reference numerals for the same constituent elements, while only the constituent elements different from those related to the first exemplary embodiment are described in other exemplary embodiments.

Parts that are unrelated to the description of the exemplary embodiments are not shown to make the description clear, and like reference numerals designate like element throughout the specification.

Throughout this specification and the claims that follow, when it is described that an element is "coupled" to another element, the element can be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements. In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

A free shape display device 100 according to an exemplary embodiment of the present disclosure will now be described in detail with reference to FIGS. 1 to 4.

Figure 2:
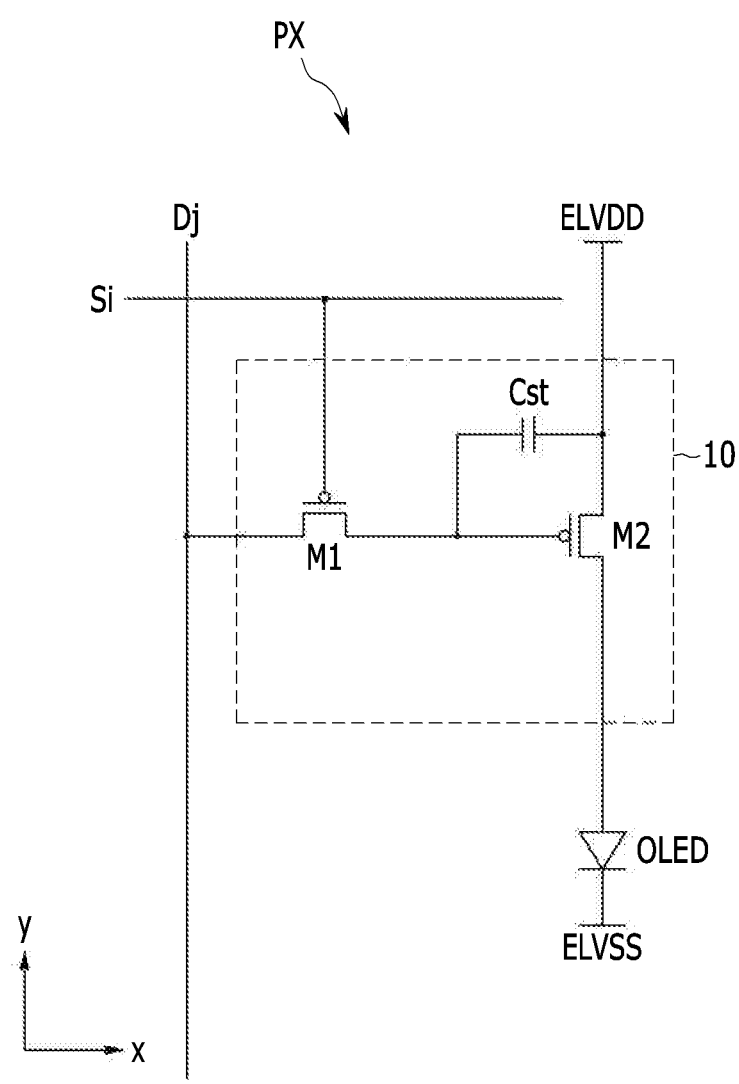
FIG. 2 illustrates a pixel circuit diagram for a pixel included in the display device of FIG. 1.
Figure 3:
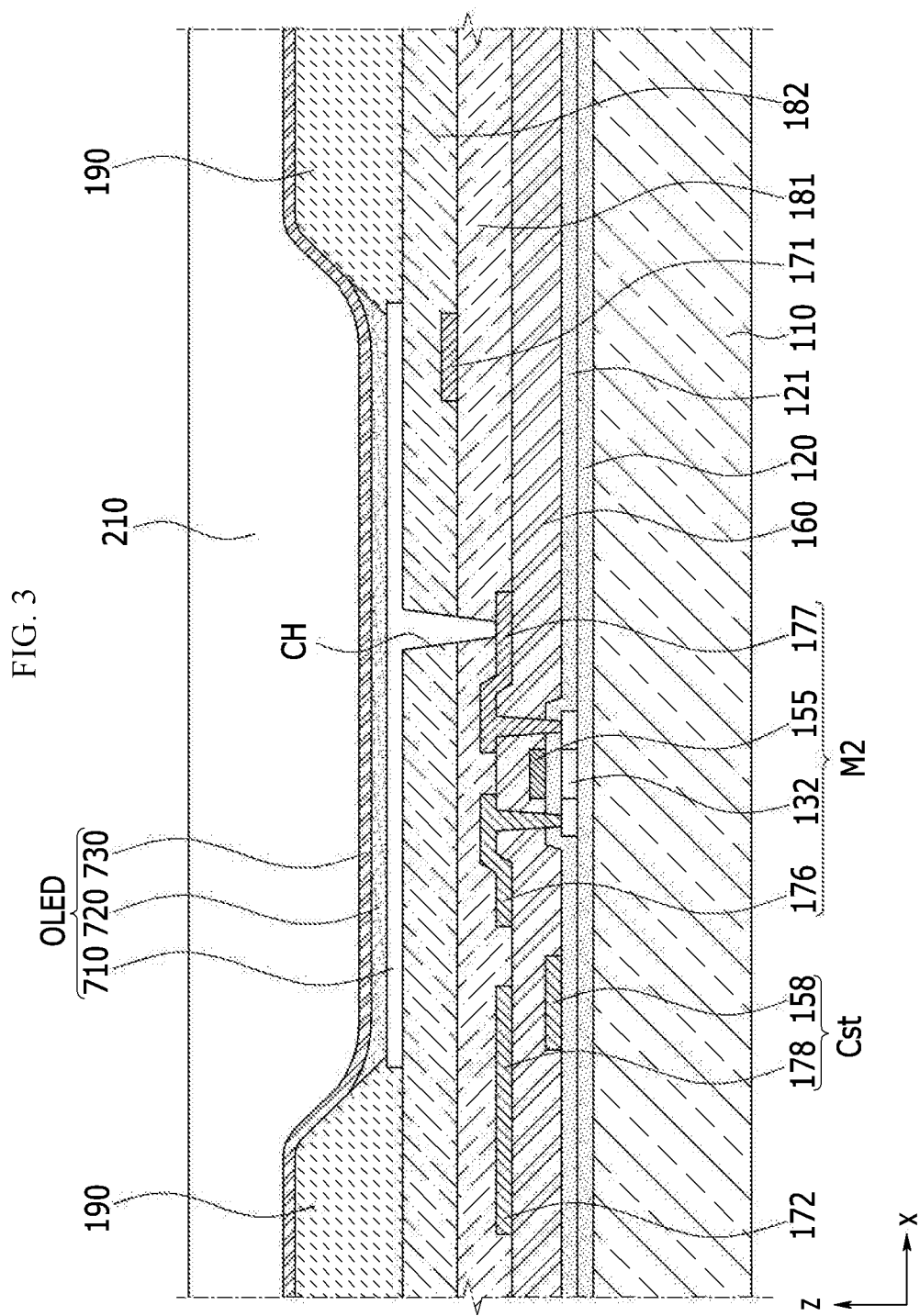
FIG. 3 illustrates a cross-sectional view of the display device of FIG. 1.
Figure 4:
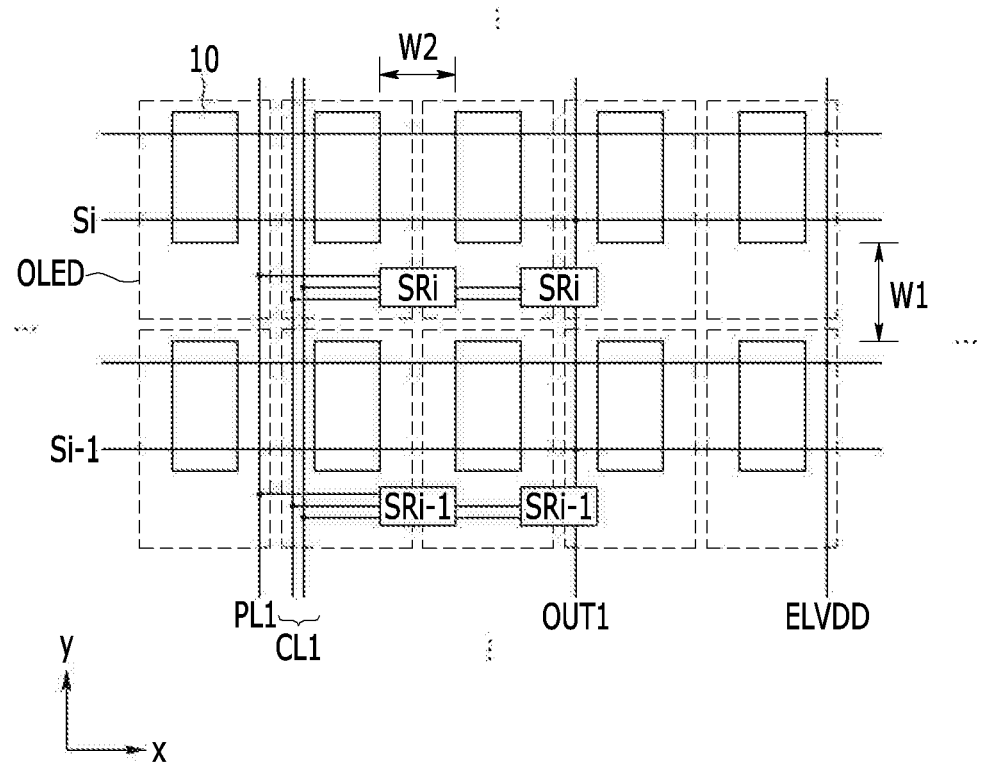
FIG. 4 illustrates a detailed block diagram of a structure in which a gate driving circuit is disposed in the display device of FIG. 1.

FIG. 1 illustrates a block diagram of a display device 100 according to an exemplary embodiment of the present disclosure. FIG. 2 illustrates a pixel circuit diagram for a pixel included in the display device 100 of FIG. 1. FIG. 3 illustrates a cross-sectional view of the display device 100 of FIG. 1. FIG. 4 illustrates a detailed block diagram of a structure in which a gate driving circuit is disposed in the display device 100 of FIG. 1.

Referring to FIG. 1, the display device 100 includes a gate driver 200, a data driver 300, and a display unit 500. Depending on embodiments, certain elements may be removed from or additional elements may be added to the display device 100 illustrated in FIG. 1. Furthermore, two or more elements may be combined into a single element, or a single element may be realized as multiple elements. This also applies to the remaining disclosed embodiments.

The display unit 500 can be formed in various shapes such as a polygonal shape, a circular shape, a shape with several curved and straight line edges, and a certain object shape. However, the display unit 500 is not limited thereto. The display unit 500 includes a plurality of pixels PX disposed corresponding to the shape of the display unit 500, a plurality of gate lines (S1 to Sn) connected the pixels PX, and a plurality of data lines (D1 to Dm). The display unit 500 refers to a display area in which images are displayed by the pixels PX.

The pixels PX included in the display unit 500 receive a first power voltage (ELVDD) and a second power voltage (ELVSS) for driving the pixels PX from the outside. As shown in FIG. 4, the first power voltage (ELVDD) is applied to a plurality of power lines that extend in a first direction (x) and a second direction (y) and are connected to each other, and the power lines can be connected to a plurality of pixel circuits 10. The second power voltage (ELVSS) can be applied to a power electrode (refer to numeral number 730 of FIG. 3) formed on the entire surface of the display unit 500.

As shown in FIG. 2, each of the pixels PX includes an organic light-emitting diode (OLED) and the pixel circuit 10 for driving the OLED. The pixel circuit 10 includes a switching transistor M1, a driving transistor M2, and a storage capacitor Cst.

The switching transistor M1 includes a gate electrode connected to a gate line (Si), one terminal connected to a data line (Dj), and the other terminal connected to a gate electrode of the driving transistor M2.

The driving transistor M2 includes a gate electrode connected to the other terminal of the switching transistor M1, one terminal connected to the first power voltage (ELVDD), and the other terminal connected to the OLED.

The storage capacitor Cst includes one electrode connected to the gate electrode of the driving transistor M2 and the other electrode connected to the first power voltage (ELVDD). The storage capacitor Cst charges a data voltage applied to the gate electrode of the driving transistor M2, and maintains the charged data voltage even after the switching transistor M1 is turned off.

The OLED includes an anode connected to the other terminal of the driving transistor M2 and a cathode connected to the second power voltage (ELVSS).

The switching transistor M1 and the driving transistor M2 can be a p-channel field effect transistor. In this case, a gate-on voltage turning on the switching transistor M1 and the driving transistor M2 is a low level voltage, and a gate-off voltage turning them off is a high level voltage.

In the present exemplary embodiment, the p-channel field effect transistor is shown, but at least one of the switching transistor M1 and the driving transistor M2 can be an n-channel field effect transistor. In this case, a gate-on voltage turning on the n-channel field effect transistor is a high level voltage, and a gate-off voltage turning it off is a low level voltage.

When the gate-on voltage is applied to the gate line (Si), the switching transistor M1 is turned on, and the data signal applied to the data line (Dj) is applied to one terminal of the storage capacitor Cst through the turned-on switching transistor M1 and charges the storage capacitor Cst. The driving transistor M2 controls an amount of current flowing from the first power voltage (ELVDD) to the OLED, corresponding to the voltage charged in the storage capacitor Cst.

The OLED emits light corresponding to an amount of current flowing through the driving transistor M2.

The OLED can emit light corresponding to one of the primary colors. The primary colors can be three primary colors such as red, green, and blue, and a desired color is displayed by the spatial or temporal sum of the three primary colors. The primary colors according to the exemplary embodiment can be yellow, cyan, magenta, etc., and the OLED can emit light of one of yellow, cyan, and magenta. The primary colors can include combinations of various colors.

In the exemplary embodiment, one OLED emits light of white, thereby improving luminance. Alternatively, the OLEDs of all of the pixels PX can emit white light, and some of the pixels PX can further include a color filter (not shown) that converts the light of white emitted from the OLEDs into one of the primary colors.

The pixel circuit 10 shown in FIG. 2 is an exemplary embodiment that controls emission of the OLED depending on the gate signal applied to the gate line (Si) and the data signal applied to the data line (Dj). The pixel circuit 10 controlling the emission of the OLED by using the gate signal and the data signal can be implemented in various kinds of known pixel circuits.

Referring to FIG. 1 again, the pixels PX are arranged in the first direction (x) and the second direction (y) perpendicular to (or crossing) the first direction (x) in the display unit 500. In this case, the number of pixels PX arranged in the first direction (x) according to a shape of the display unit 500 can be changed depending on the second direction (y). Alternatively, the number of the pixels PX arranged in the second direction (y) according to the shape of display unit 500 can be changed depending on the first direction (x).

In FIG. 1, the display unit 500 is shown in a pentagonal shape, but is not limited thereto. In FIG. 1, the number of pixels PX arranged in the first direction (x) is changed depending on the second direction (y), and the number of the pixels PX arranged in the second direction (y) is changed depending on the first direction (x).

The gate lines (S1 to Sn) extend in the first direction (x) to be substantially parallel to each other, and are connected to the pixels PX.

The data lines (D1 to Dm) radially extend in the display unit 500 to be connected to the pixels PX. For example, the data lines (D1 to Dm) can extend to gradually extend farther from each other in the display unit 500 and be connected to the pixels PX. In addition, some of the data lines (D1 to Dm) can extend substantially parallel to each other in the second direction (y), and the others can extend to gradually extend from each other. According to embodiments, when the display unit 500 has an edge that is formed in a third direction inclined to the first direction (x), some of the data lines (D1 to Dm) can extend along the edge inclined in the third direction, and at least one of the data lines (D1 to Dm) can extend substantially parallel to the third direction.

The number of the data lines (D1 to Dm) can be equal to or greater than the maximum number of the pixels PX arranged in the first direction (x). Alternatively, the number of the data lines (D1 to Dm) can be equal to or greater than the maximum number of the pixels PX arranged in the second direction (y).

In FIG. 1, one left side of the display unit 500 is inclined to the left, some of the data lines (D1-D3) extend along the inclined one left side, and the first data line D1 extends substantially parallel to the one left side. In addition, one right side of the display unit 500 is angled to the right, and an m-th data line (Dm) extends substantially parallel to the one right side. Some of the data lines (Dj, Dj+1) extend substantially parallel to each other in the second direction (y). The maximum number of the pixels PX connected to an i-th gate line (Si) is m (m is a natural number), and there are m data lines (D1 to Dm) are provided. The pixels PX connected to the i-th gate line (Si) are respectively connected to the data lines (D1 to Dm). The number of the pixels PX arranged in the first direction (x) corresponding to the gate lines other than the i-th gate line (Si) is equal to or less than the number m, and the pixels PX are selectively connected to m data lines (D1 to Dm) adjacent thereto.

The data lines (D1 to Dm) extend radially in the display unit 500, such that the data lines (D1 to Dm) cross at least one of the pixel circuits 10. The data lines (D1 to Dm) and the pixel circuit 10 can each be disposed in different layers so that the data lines (D1 to Dm) crossing the pixel circuit 10 are not short-circuited to the pixel circuit 10. This will be described with reference with FIG. 3. FIG. 3 illustrates a cross-sectional view associated with the driving transistor M2, the storage capacitor Cst, and the OLED included in one pixel PX of the display device.

Referring to FIG. 3, a buffer layer 120 is disposed on an insulation substrate 110. The shape of the insulating substrate 110 can determine the shape of the display area. For example, the insulation substrate 110 is formed in various shapes such as a polygonal shape, a circular shape, a shape with several curved and straight line edges, and a certain object shape, thereby determining the shape of the display area.

The buffer layer 120 plays a role of preventing penetration of undesired components, such as impure elements or moisture, while flattening the surface thereof. However, the buffer layer 120 is not necessarily required, and can be omitted depending on the kind and processing conditions of the insulation substrate 110.

A semiconductor layer 132 formed of amorphous silicon, polysilicon, or the like is disposed on the buffer layer 120. The semiconductor layer 132 can include an oxide semiconductor.

A first insulating layer 121 is disposed on the semiconductor layer 132 and the buffer layer 120. The buffer layer 120 and the first insulating layer 121 can be disposed in a single layer structure of a silicon nitride (SiNx) or a double layer structure in which a silicon nitride (SiNx) and a silicon oxide (SiOx) are stacked.

A gate electrode 155 is disposed on the first insulating layer 121 to overlap the semiconductor layer 132. Further, one electrode 158 of the storage capacitor Cst is disposed on the first insulating layer 121.

A second insulating layer 160 is disposed on the gate electrode 155, the one electrode 158 of the storage capacitor Cst, and an exposed first insulating layer 121.

A source electrode 176 and a drain electrode 177 that face each other are disposed on the second insulating layer 160. The source electrode 176 can be connected to one end of the semiconductor layer 132 through one contact hole penetrating through the first insulating layer 121 and the second insulating layer 160/The drain electrode 177 can be connected to the other end of the semiconductor layer 132 through another contact hole penetrating through the first insulating layer 121 and the second insulating layer 160. The gate electrode 155, the source electrode 176, and the drain electrode 177 together with the semiconductor layer 132 form one thin film transistor (TFT), that is, the driving transistor M2. A channel of the driving transistor M2 is disposed in an area of the semiconductor layer 132 between the source electrode 176 and the drain electrode 177.

A power line 172 of the first power voltage (ELVDD) is disposed on the second insulating layer 160. The storage capacitor Cst includes the one electrode 158 and another electrode 178 with the second insulating layer 160 disposed therebetween. Part of the power line 172 of the first power voltage (ELVDD) can become the other electrode 178 of the storage capacitor Cst. In this case, the second insulating layer 160 becomes a dielectric material of the storage capacitor Cst.

A first organic layer 181 is disposed on the driving transistor M2 and the storage capacitor Cst. A data line 171 is disposed on the first organic layer 181. Further, a second organic layer 182 is disposed on the first organic layer 181 and the data line 171. For example, the data line 171 is disposed between the first organic layer 181 and the second organic layer 182.

A pixel electrode 710 is disposed on the second organic layer 182, and the pixel electrode 710 is connected to the drain electrode 177 of the driving transistor M2 through a contact hole (CH) penetrating through the first organic layer 181 and the second organic layer 182. An organic emission layer 720 is disposed on the pixel electrode 710, and a power electrode 730 is disposed on the organic emission layer 720 of the second power voltage (ELVSS). The power electrode 730 can be formed of a transparent conductor such as ITO, IZO, etc. The pixel electrode 710, the organic emission layer 720, and the power electrode 730 form the OLED. Holes and electrons from the pixel electrode 710 and the power electrode 730 are injected into the organic emission layer 720, and light is emitted when excitons in which the injected holes and electrons are combined drop from an excited state to a ground state.

As such, by forming the data lines 171 in layers except for the layers in which the driving transistor M2 and the OLED are respectively formed, even though the data lines 171 extend radially in the display unit 500, it is possible for the pixel circuit 10 and the OLED to not be short-circuited, thereby reducing the problem conditions associated with the radial extension of the data lines 171.

Alternatively, although the data lines 171 extend radially in the display unit 500, when the data lines 171 and the pixel circuit 10 can be formed so as to not be short-circuited, the first organic layer 181 can be omitted, and the data line 171 can be disposed on the second insulating layer 160.

An insulating layer 190 defining an area of the OLED can be formed around the pixel electrode 710.

An encapsulation layer 210 for protecting the OLED can be disposed on the OLED. The encapsulation layer can be formed of inorganic layers and organic layers that are alternately stacked. The inorganic layer is thin, but it is dense, and thus it can function as a barrier to moisture, oxygen, and the like. The organic layer acts for flattening, and it can reduce stress of the inorganic layer. The inorganic layer can be formed of one selected from a silicon oxide, a silicon nitride, a silicon oxynitride, an aluminum oxide, an aluminum nitride, an aluminum oxynitride, a titanium oxide, a titanium nitride, a tantalum oxide, a tantalum nitride, a hafnium oxide, a hafnium nitride, a zirconium oxide, a zirconium nitride, a cerium oxide, a cerium nitride, a tin oxide, a tin nitride, and a magnesium oxide. The organic layer can be formed of an acryl-based resin, a methacrylate-based resin, an isoprene-based resin, a vinyl-based resin, an epoxy-based resin, a urethane-based resin, a cellulose-based resin, a perylene-based resin, an imide-based resin, or a mixture of two or more thereof.

According to exemplary embodiments, the encapsulation layer 210 is formed of an encapsulation member such as transparent glass or plastic, and the encapsulation member is bonded to the insulation substrate 110 by a sealant (not shown), seal the internal space thereof, and protect the OLED.

Since the above-described structures of the driving transistor M2 and the OLED are only exemplary embodiments, the present disclosure is not limited thereto, and various known structures of the thin film transistors and the OLED can be used.

Referring to FIG. 1 again, the display device further includes a signal controller, which is not shown in FIG. 1. The signal controller can be integrated to the data driver 300. The signal controller receives an image signal inputted from an external device and an input control signal of controlling display of the image signal. The image signal has luminance information of each of the pixels PX, and the luminance information has predetermined numbers, for example, 1024, 256, or 64 gray levels. The signal controller controls the image signal to be suitable for operating conditions of the display unit 500 and the data driver 300 based on the image signal and the input control signal, and generates a gate control signal, a data control signal, and an image data signal. The signal controller transmits the gate control signal to the gate driver 200, and transmits the data control signal and the image data signal to the data driver 300.

The gate driver 200 includes a plurality of gate driving circuits (SR1 to SRn), and is disposed in the display area. The gate driving circuits (SR1 to SRn) are respectively connected to the gate lines (S1 to Sn). The gate driver 200 sequentially applies the gate signal consisting of a combination of the gate-on voltage for turning on the switching transistor (M1 of FIG. 2) and the gate-off voltage for turning off the switching transistor (M1 of FIG. 2), depending on the gate control signal, to the gate lines (Si to Sn). For example, the gate driving circuits (SR1 to SRn) sequentially output the gate signal.

The gate driving circuits (SR1 to SRn) are disposed in the display area. The pixel circuits 10 are disposed to be spaced apart from each other at a predetermined interval, and the OLEDs corresponding to the pixel circuits 10 are formed to have an area that is larger than that of the pixel circuits 10 and disposed to be adjacent to each other at a narrower interval than the interval between the pixel circuits 10. The gate driving circuits (SR1 to SRn) are disposed between the pixel circuits 10. For example, the gate driving circuits (SR1 to SRn) are disposed in areas that do not overlap the pixel circuits 10 in at least one of the first direction (x) and the second direction (y) to be connected to the gate lines (S1 to Sn). A structure of the gate driving circuits (SR1 to SRn) disposed in the display unit 500 will be exemplarily described with reference to FIG. 4.

Referring to FIG. 4, a plurality of pixel circuits 10 are disposed to be spaced apart from each other at a second interval W2 in the first direction (x) and to be spaced apart from each other at a first interval W1 in the second direction (y). A plurality of OLEDs corresponding to the pixel circuits 10 are disposed to be adjacent to each other to the extent that the first interval W1 and the second interval W2 are substantially covered. With the OLEDs being adjacently disposed to each other, the pixels PX are substantially viewed to be adjacent to each other by a user. That the pixel circuits 10 are spaced apart from each other means that areas that the pixel circuits 10 occupy are spaced apart from each other, and the pixel circuits 10 can be electrically connected to the gate lines (Si to Sn), the power line of the first power voltage (ELVDD), and the like.

When the pixel circuits 10 are disposed to be spaced apart from each other at the first interval W1 and the second interval W2, the gate driving circuits (SRi-1 and SRi) are disposed in areas in which areas that do not overlap the pixel circuits 10 in the first direction (x) and areas that do not overlap the pixel circuits 10 in the second direction (y) cross each other. For example, the gate driving circuits (SRi-1 and SRi) are disposed in the areas that do not overlap the pixel circuits 10 in the first direction (x) and the second direction (y). Each of the gate driving circuits (SRi-1 and SRi) can occupy an area that is larger than the area that does not overlap the pixel circuits 10 in the first direction (x) and the second direction (y). In this case, as shown in FIG. 4, each gate driving circuit (SRi-1 or SRi) that can generate one gate signal is dispersedly disposed in the areas that do not overlap the pixel circuits 10, and the areas consisting of one gate driving circuit (SRi-1 or SRi) can be dispersed along the first direction (x) or the second direction (y).

A plurality of clock wires CL1 to which clock signals for driving the gate driving circuits (SRi-1 and SRi) are applied and a power wire PL1 to which a power voltage is applied can be disposed to extend in the second direction (y). For example, the clock wires CL1 and the power wire PL1 are disposed between the pixel circuits 10. The clock wires CL1 and the power wire PL1 are disposed in areas that do not overlap the pixel circuits 10 to be connected to the gate driving circuits (SRi-1 and SRi). The numbers of the clock wire CL1 and the power wire PL1 are not limited thereto, and they can vary depending on the configurations of the gate driving circuits (SRi-1 and SRi).

An output wire OUT1 from which output signals of the gate driving circuits (SRi-1 and SRi) are outputted is disposed in areas that do not overlap the pixel circuits 10 in the second direction (y) to be connected to the gate lines (Si-1 and Si). An output signal of the previous gate driving circuit (SRi-1) is an input signal of the next gate driving circuit (SRi), and the output wire OUT1 of the previous gate driving circuit (SRi-1) can be referred to an input wire of the next gate driving circuit (SRi).

In the present exemplary embodiment, the gate driving circuits (SRi-1 and SRi) are shown in the structure in which the gate driving circuits are disposed in the areas that do not overlap the pixel circuits 10 in the first direction (x) and the second direction (y), but, according to exemplary embodiments, the gate driving circuits (SRi-1 and SRi) are disposed in areas that do not overlap the pixel circuits 10 in only one direction of the first direction (x) and the second direction (y).

A plurality of power lines to which the first power voltage (ELVDD) is applied can extend in the first direction (x) and the second direction (y) to be connected to each other, and the power lines can be connected to the pixel circuits 10. The number of the power lines extending in the second direction (y) can be one or more, and the number of the power lines extending in the first direction (x) can correspond to the number of pixel rows.

Referring to FIG. 1 again, the data driver 300 is connected to the data lines (D1 to Dm) and selects a gray voltage depending on the image data signal. The data driver 300 applies the selected gray voltage as a data signal to the data lines (D1 to Dm), depending on the data control signal.

Although the pixels PX are disposed at predetermined intervals, as the data lines (D1 to Dm) extend radially, the number of the data lines (D1 to Dm) is greater than the number of the pixels PX connected to the gate lines (e.g., S1 and S2) adjacent to the data driver 300, and each pixel PX is selectively connected to the data lines of some of the data lines (D1 to Dm). Accordingly, when the gate signal of the gate-on voltage is applied to the gate lines S1 and S2 adjacent to the data driver 300, the data driver 300 does not need to apply the data signal to all of the data lines (D1 to Dm) but can selectively apply it to only the data lines connected to the pixels PX.

As such, when the signal controller generates image data signals so that the data signals are selectively applied, it can generate the image data signals by using a lookup table representing the connection relationship between the data lines (D1 to Dm) and the pixels PX. According to exemplary embodiments, in a structure in which the signal controller is integrated in the data driver 300, it is possible to generate the image data signal in the data driver 300 by using the lookup table representing the connection relationship between the data lines (D1 to Dm) and the pixels PX.

Table 1 is an exemplary lookup table representing the connection relationship between the data lines (D1 to Dm) and the pixels PX.

TABLE 1

| Gate line | Data line | | | | | | | |
|---|---|---|---|---|---|---|---|---|
| | D1 | D2 | D3 | ... | Dj | Dj + 1 | ... | Dm |
| S1 | 0 | X | X | ... | 0 | 0 | ... | 0 |
| S2 | 0 | X | 0 | ... | 0 | 0 | ... | 0 |
| ... | ... | ... | ... | ... | ... | ... | ... | ... |
| Si | 0 | 0 | 0 | ... | 0 | 0 | ... | 0 |
| ... | ... | ... | ... | ... | ... | ... | ... | ... |
| Sn | X | X | X | ... | 0 | 0 | ... | X |

In Table 1, a "0" means that the data lines (D1 to Dm) are connected to the pixels PX, and symbol X means that the data lines (D1 to Dm) are not connected to the pixel PX. Since the signal controller generates the image data signals with respect to only the data lines (D1 to Dm) connected to the pixels PX, unnecessary signal-processing time is prevented. The data driver 300 can generate data signals depending on the image data signals and output them only to the data lines connected to the pixels PX.

According to exemplary embodiments, the data driver 300 applies about a 0 voltage or an arbitrary voltage to data lines that are not connected to the pixels PX.

A display device according to another exemplary embodiment will now be described with reference to FIGS. 5 and 6. Compared to the display devices described with reference to FIGS. 1 to 4, differences will be mainly described.

Figure 5:
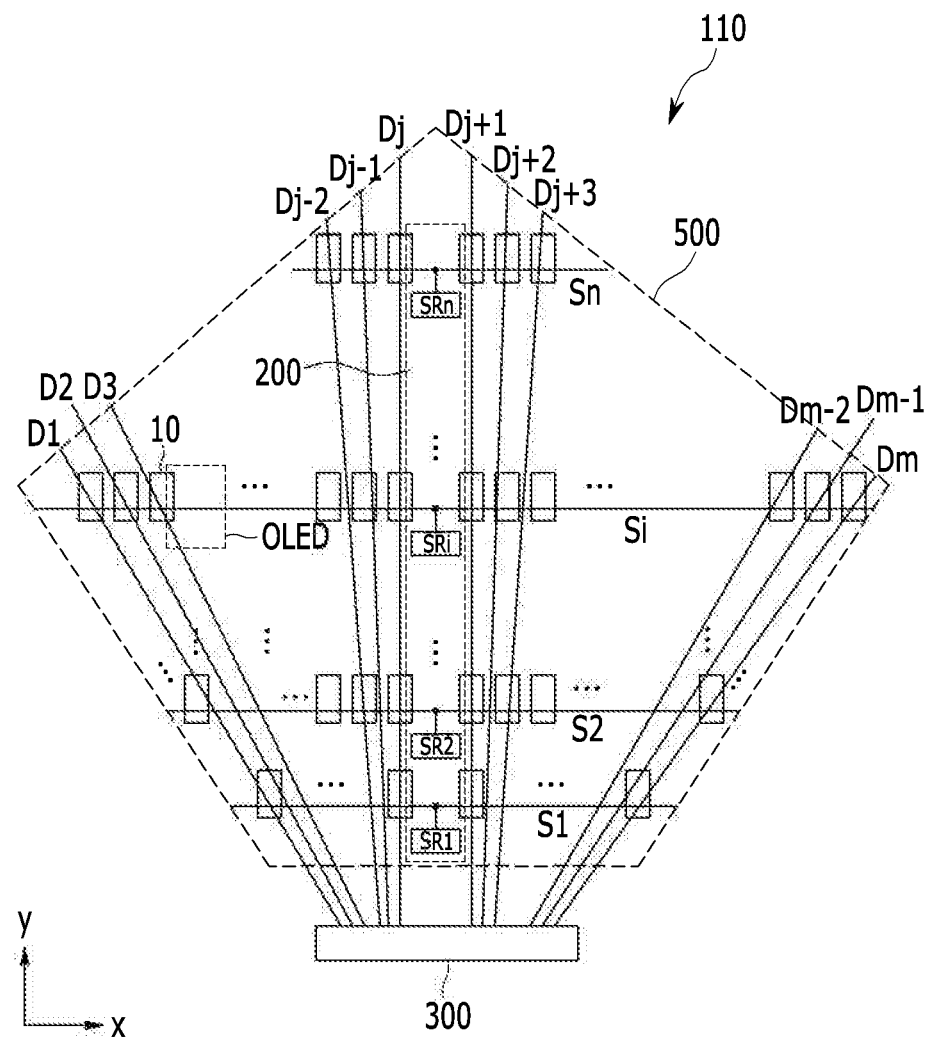
FIG. 5 illustrates a block diagram of a display device according to another exemplary embodiment of the present disclosure.

FIG. 5 illustrates a block diagram of a display device 110 according to another exemplary embodiment of the present disclosure. FIG. 6 illustrates a detailed block diagram of a structure in which a gate driving circuit is disposed in the display device 110 of FIG. 5.

Figure 6:
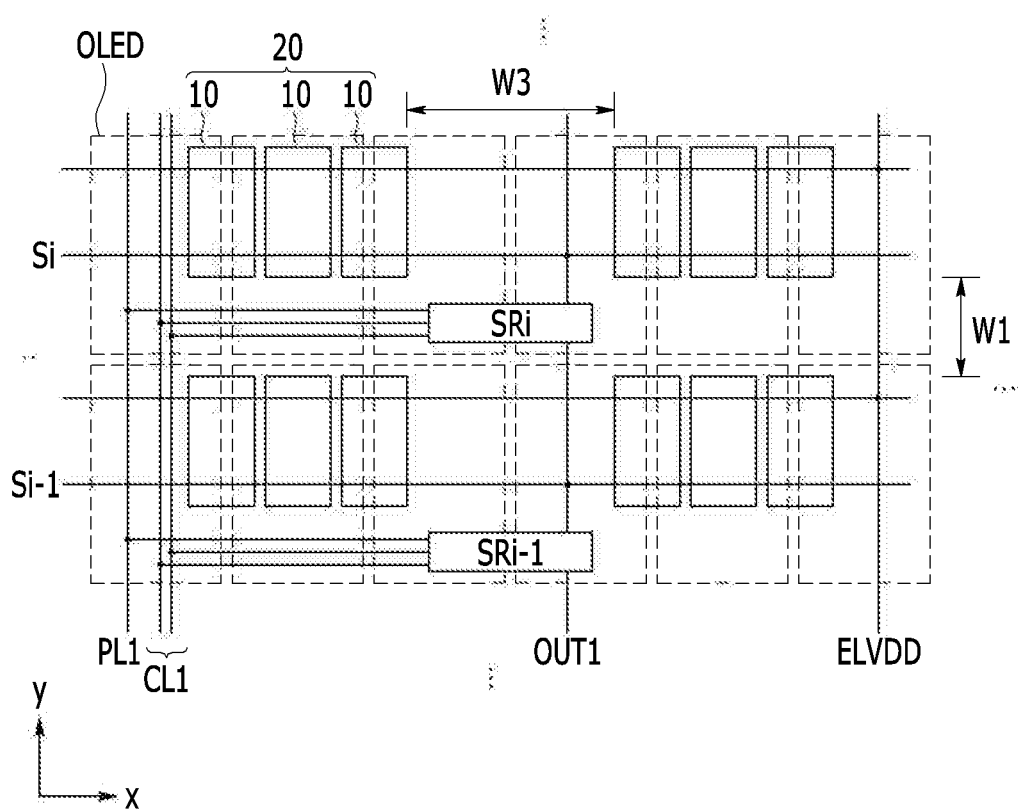
FIG. 6 illustrates a detailed block diagram of a structure in which a gate driving circuit is disposed in the display device of FIG. 5.

Referring to FIGS. 5 and 6, a plurality of pixels PX can be distinguished by dots (dot) formed of pixels PX displaying different primary colors. For example, the OLED emits light of one of three primary colors of red, green, and blue, and thus the pixels can be divided into a red pixel, a green pixel, and a blue pixel. Adjacent red, green, and blue pixels are gathered together to form one dot.

The pixel circuits 10 corresponding to the one dot are disposed to be adjacent to each other. The pixel circuits 10 disposed to be adjacent to each other corresponding to the one dot refer to a dot circuit portion (or dot circuit) 20. For example, when three pixel circuits 10 are disposed to be adjacent to each other in the first direction (x), the adjacent disposed three pixel circuits 10 refers to the dot circuit portion 20. A plurality of dot circuit portions 20 are disposed to be spaced apart from each other at a predetermined interval. In the present exemplary embodiment, the pixel circuits 10 forming the dot circuit portion 20 are disposed to be adjacent to each other in the first direction (x), but the present disclosure is not limited thereto. For example, the pixel circuits 10 forming the dot circuit portion 20 can be disposed in various shapes such as a stripe shape and a honeycomb shape.

As shown in FIG. 6, the dot circuit portions 20 including the three pixel circuits 10 are disposed to be spaced apart from each other at a third interval W3 in the first direction (x) and to be spaced apart from each other at the first interval W1 in the second direction (y). The OLEDs corresponding to the pixel circuits 10 are disposed to be adjacent to each other to the extent that the first interval W1 and the third interval W3 are substantially covered. That the dot circuit portions 20 are spaced apart from each other means that areas that the dot circuit portions 20 occupy are spaced apart from each other, and the dot circuit portions 20 can be electrically connected to the gate lines (Si to Sn), the power line of the first power voltage (ELVDD), and the like.

When the dot circuit portions 20 are disposed to be spaced apart from each other at the first interval W1 and the third interval W3, the gate driving circuits (SRi-1 and SRi) are disposed in areas that do not overlap the dot circuit portions 20 in the first direction (x) and areas that do not overlap the dot circuit portions 20 in the second direction (y), cross each other. For example, the gate driving circuits (SRi-1 and SRi) are disposed in the areas that do not overlap the dot circuit portions 20 in the first direction (x) and the second direction (y). The third interval W3 between the dot circuit portions 20 is greater than the second interval W2 between the pixel circuits 10 described in FIG. 4. Accordingly, the areas in which the gate driving circuits (SRi-1 and SRi) can be respectively disposed can increase, such that it is possible for the gate driving circuits (SRi-1 and SRi) to not be dispersed by dividing the gate driving circuits (SRi-1 and SRi).

In the present exemplary embodiment, the gate driving circuits (SRi-1 and SRi) are shown in the structure in which the gate driving circuits are disposed in the areas that do not overlap the dot circuit portions 20 in the first direction (x) and the second direction (y), but, according to exemplary embodiments, the gate driving circuits (SRi-1 and SRi) are disposed in areas that do not overlap the dot circuit portions 20 in only one direction of the first direction (x) and the second direction (y).

A display device according to a further exemplary embodiment will be described with reference to FIGS. 7 to 9. Compared to the display devices described with reference to FIGS. 1 to 4, differences will be mainly described.

Figure 7:
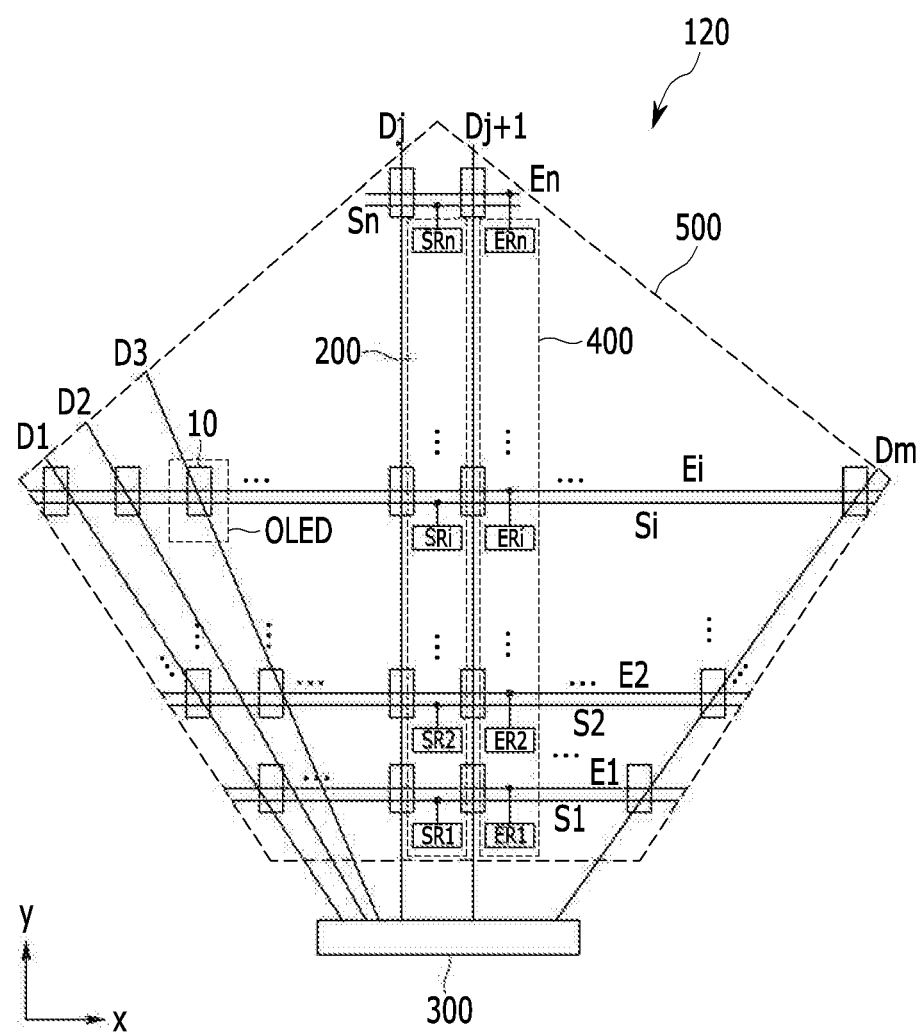
FIG. 7 illustrates a block diagram of a display device according to a further exemplary embodiment of the present disclosure.

FIG. 7 illustrates a block diagram of a display device 120 according to a further exemplary embodiment of the present disclosure. FIG. 8 illustrates a pixel circuit diagram for a pixel included in the display device 120 of FIG. 7. FIG. 9 illustrates a detailed block diagram of a structure in which a gate driving circuit and an emission driving circuit are disposed in the display device of FIG. 7.

Figure 8:
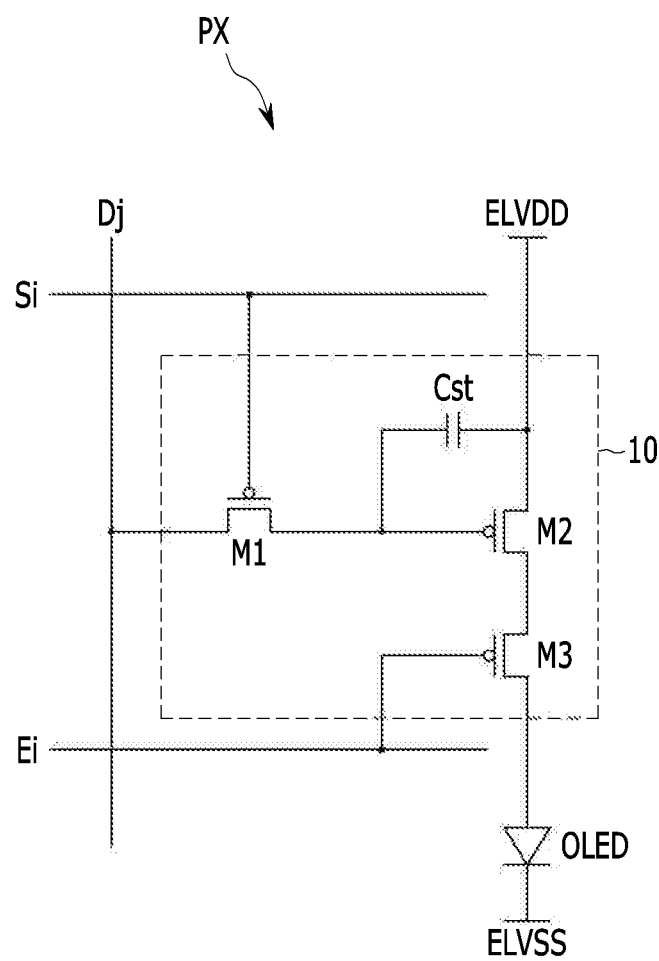
FIG. 8 illustrates a pixel circuit diagram for a pixel included in the display device of FIG. 7.

As shown in FIG. 8, a pixel circuit 10 further includes an emission transistor M3. The emission transistor M3 includes a gate electrode connected to an emission signal line (Ei), one terminal connected to the other terminal of the driving transistor M2, and the other terminal connected to the OLED. When an emission signal of a gate-on voltage is applied to the emission signal line (Ei), the emission transistor M3 is turned on, and current flowing through the driving transistor M2 is transmitted to the OLED, such that the OLED emits light.

As such, the pixel circuit 10 controls emission of the OLED depending on the emission signal applied to the emission signal line (Ei) as well as the gate signal applied to the gate line (Si) and the data signal applied to the data line (Dj). The pixel circuit 10 controlling the emission of the OLED by using the gate signal, the data signal, and the emission signal can be implemented in various kinds of known pixel circuits.

For driving the pixel circuit 10, the display device further includes a plurality of emission signal lines (E1 to En) extending in the first direction (x) to be substantially parallel to each other, and an emission driver 400. The signal controller generates an emission control signal for controlling operation of the emission driver 400.

The emission signal lines (E1 to En) are connected to the pixel circuits 10.

The emission driver 400 can be connected to the emission signal lines (E1 to En) and be disposed in the display area. The emission driver 400 includes a plurality of emission driving circuits (ER1 to ERn). The emission driving circuits (ER1 to ERn) are respectively connected to the emission signal lines (E1 to En). The emission driver 400 sequentially applies the emission signal consisting of a combination of the gate-on voltage turning on the emission transistor M3 and the gate-off voltage turning off the emission transistor M3, depending on the emission control signal, to the emission signal lines (E1 to En). For example, the emission driving circuits (ER1 to ERn) sequentially output the emission signal.

The emission driving circuits (ER1 to ERn) are disposed in the display area. The emission driving circuits (ER1 to ERn) can be disposed in the same way in which the gate driving circuits (SR1 to SRn) are disposed in the display unit 500. For example, the emission driving circuits (ER1 to ERn) are disposed in areas in which the emission driving circuits (ER1 to ERn) do not overlap the pixel circuits 10 in at least one of the first direction (x) and the second direction (y) to be connected to the emission signal lines (E1 to En).

Figure 9:
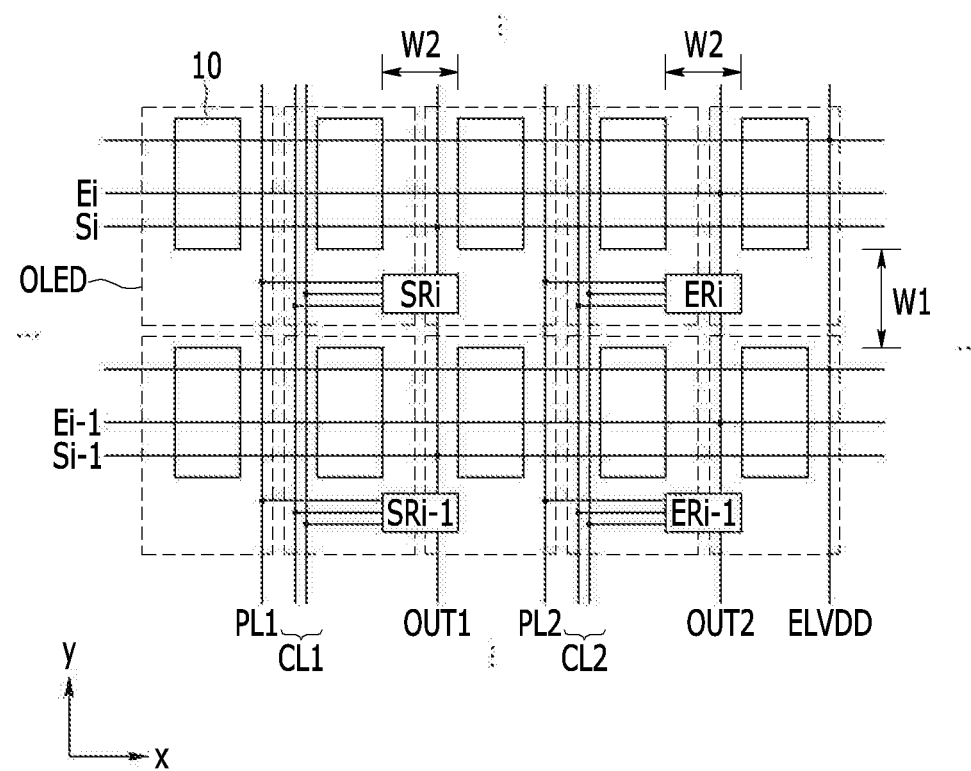
FIG. 9 illustrates a detailed block diagram of a structure in which a gate driving circuit and an emission driving circuit are disposed in the display device of FIG. 7.

As shown in FIG. 9, the emission driving circuits (ERi-1 and ERi) are disposed in areas in which areas W1 that do not overlap the pixel circuits 10 in the first direction (x) and areas W2 that do not overlap the pixel circuits 10 in the second direction (y), cross each other. For example, the emission driving circuits (ERi-1 and ERi) are disposed in the areas that do not overlap the pixel circuits 10 in the first direction (x) and the second direction (y).

Although not shown in the present exemplary embodiment, the emission driving circuits (ERi-1 and ERi) can occupy an area larger than the area that does not overlap the pixel circuits 10 in the first direction (x) and the second direction (y), and in this case, the emission driving circuits (ERi-1 and ERi) are divided and the divided emission driving circuits each can be dispersedly disposed in the areas that do not overlap the pixel circuits 10 in the first direction (x) and the second direction (y).

A plurality of clock wires CL2 to which clock signals for driving the emission driving circuits (ERi-1 and ERi) are applied and a power wire PL2 to which a power voltage is applied can be disposed in the areas that do not overlap the pixel circuits 10 in the second direction (y) to be connected to the emission driving circuits (ERi-1 and ERi). The numbers of the clock wire CL2 and the power wire PL2 are not limited, and they can vary depending on the configurations of the gate driving circuits (SRi-1 and SRi).

An output wire OUT2 from which output signals of the emission driving circuits (ERi-1 and ERi) are outputted is disposed in areas that do not overlap the pixel circuits 10 in the second direction (y) and connected to the emission signal lines (Ei-1, Ei). An output signal of the previous emission driving circuit (ERi-1) is an input signal of the next emission driving circuit (ERi), and the output wire OUT2 of the previous emission driving circuit (ERi-1) can be referred to as an input wire of the next emission driving circuit (ERi).

A display device according to a further exemplary embodiment will be described with reference to FIGS. 10 to 12. Compared to the display devices described with reference to FIGS. 5 to 6 and the display devices described with reference to FIGS. 7 to 9, differences will be described.

Figure 10:
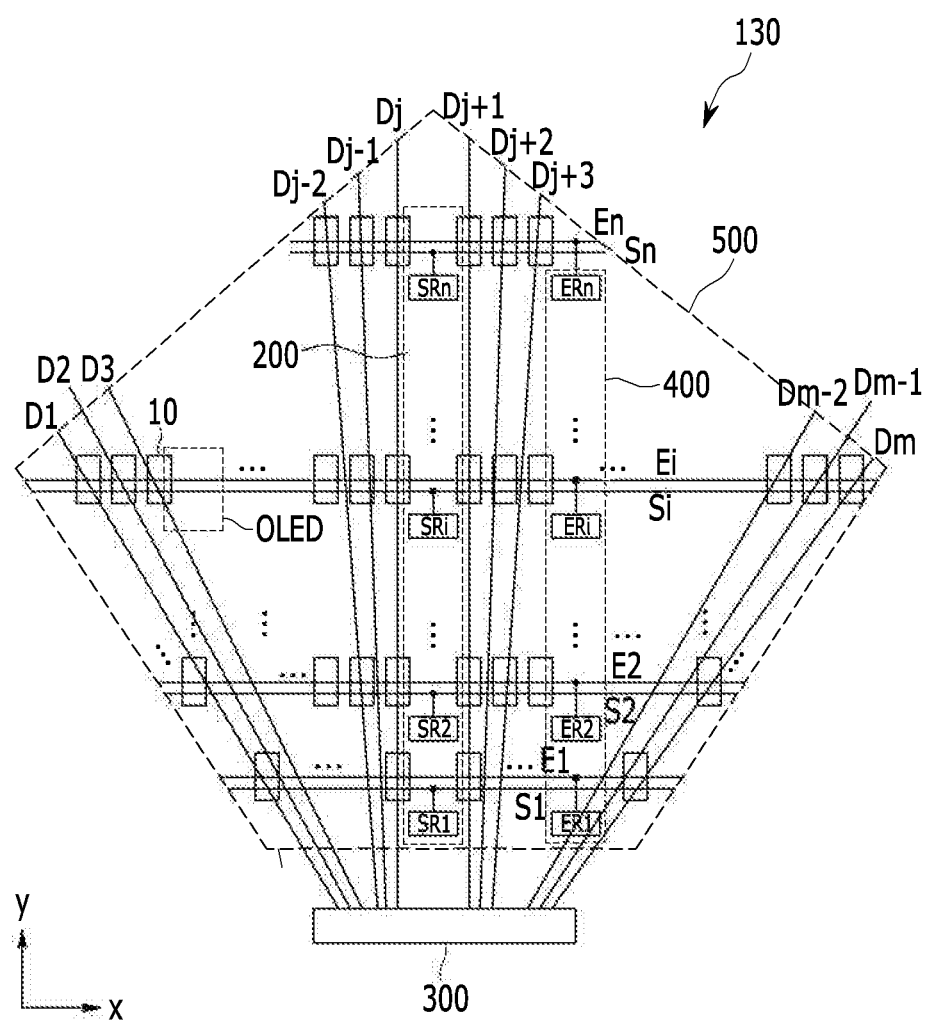
FIG. 10 illustrates a block diagram of a display device according to a further exemplary embodiment of the present disclosure.

FIG. 10 illustrates a block diagram of a display device 130 according to a further exemplary embodiment of the present disclosure. FIGS. 11 and 12 each illustrate a detailed block diagram of a structure in which a gate driving circuit and an emission driving circuit are disposed in the display device 130 of FIG. 10.

Figure 11:
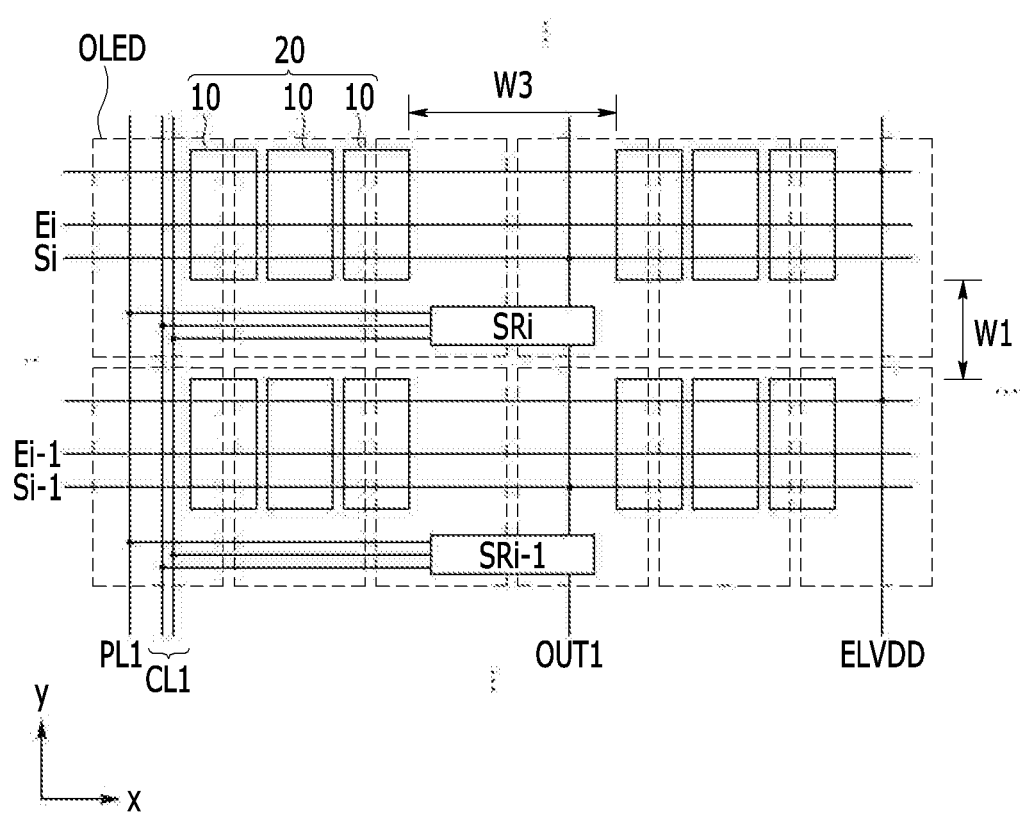
FIGS. 11 and 12 each illustrates a detailed block diagram of a structure in which a gate driving circuit and an emission driving circuit are disposed in the display device of FIG. 10.
Figure 12:
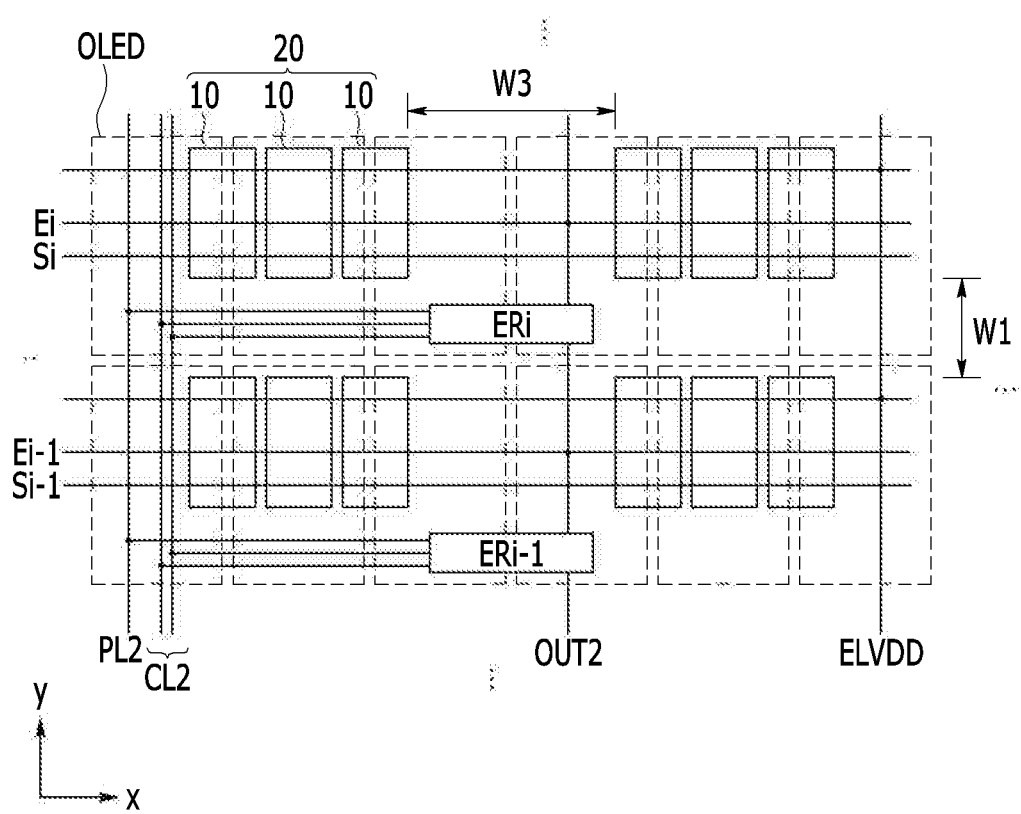

Referring to FIGS. 10 to 12, three pixel circuits 10 are disposed to be adjacent to each other in the first direction to form the dot circuit portion 20. A plurality of dot circuit portions 20 are disposed to be spaced apart from each other at a predetermined interval. For example, the dot circuit portions 20 are disposed to be spaced apart from each other at the third interval W3 in the first direction (x) and to be spaced apart from each other at the first interval W1 in the second direction (y). The OLEDs corresponding to the pixel circuits 10 are disposed to be adjacent to each other to the extent that the first interval W1 and the third interval W3 are substantially covered. The disposed configuration of such a dot circuit portion 20 is the same as that described in FIGS. 5 to 6.

Further, since the configuration of the gate driving circuits (SRi-1 and SRi) disposed in the display unit 500 is the same as that described in FIGS. 5 to 6, a detailed description thereof will be omitted.

As shown in FIG. 8, the pixel circuit 10 further includes the emission transistor M3, and the display device further includes the emission signal lines (E1 to En) extending in the first direction (x) to be substantially parallel to each other and an emission driver 400. The emission driver 400 includes the emission driving circuits (ERi to ERn). The emission driving circuits (ERi to ERn) are respectively connected to the emission signal lines (E1 to En). The emission driving circuits (ERi to ERn) are disposed in the display unit 500. The structure in which the emission driving circuits (ERi to ERn) are disposed in the display unit 500 is the same as that in which the gate driving circuits (SRi-1 and SRi) are disposed. For example, the emission driving circuits (ER1 to ERn) are disposed in areas that do not overlap the dot circuit portions 20 in at least one of the first direction (x) and the second direction (y) to be connected to the emission signal lines (E1 to En).

As shown in FIG. 12, the emission driving circuits (ERi-1 and ERi) are disposed in areas in which areas W1 that do not overlap the dot circuit portions 20 in the first direction (x) and areas W3 that do not overlap the dot circuit portions 20 in the second direction (y), cross each other. For example, the emission driving circuits (ERi-1 and ERi) are disposed in the areas that do not overlap the dot circuit portions 20 in the first direction (x) and the second direction (y).

Display devices of exemplary embodiments in which the data lines (D1 to Dm) are radially disposed and in which the gate driving circuits (SR1 to SRn) and the emission driving circuits (ERi to Ern) are not disposed in the display unit 500 will now be described with reference to FIGS. 13 to 16. Compared to the display devices described in FIGS. 1 to 4, differences will be mainly described.

Figure 13:
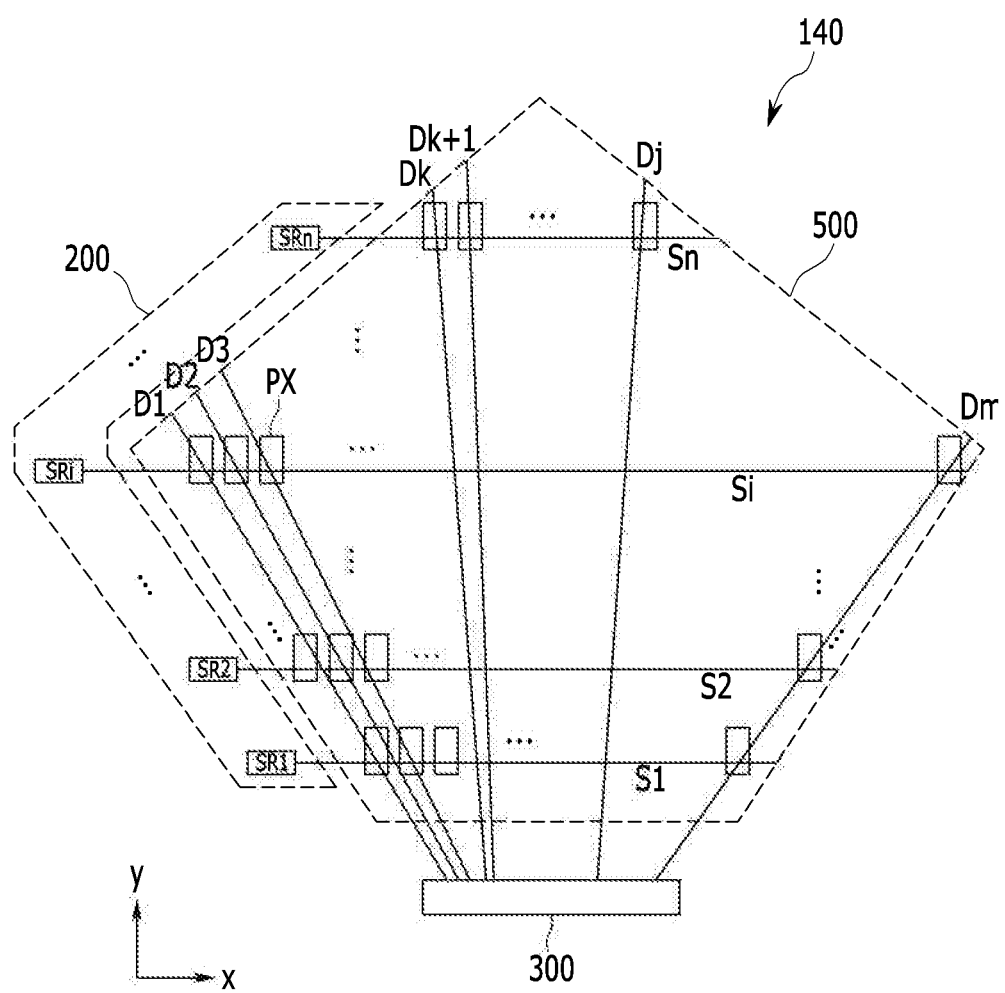
FIG. 13 illustrates a block diagram of a display device according to a further exemplary embodiment of the present disclosure.

FIG. 13 illustrates a block diagram of a display device 140 according to a further exemplary embodiment of the present disclosure. As shown in FIG. 2, a plurality of pixels PX are pixels that are driven by using gate signals and data signals.

Referring to FIG. 13, a plurality of pixels PX are disposed in the display unit 500 to correspond to a shape of the display unit 500. Since the gate driving circuits (SR1 to SRn) and the emission driving circuits (ER1 to Ern) are not disposed in the display unit 500, the OLED is required to have an area that is wider than the pixel circuit 10. For example, the pixel circuits 10 can be disposed to be adjacent to each other, and the OLED can be formed on the pixel circuit 10 in an area similar to that of the pixel circuit 10.

The gate lines (S1 to Sn) extend in the first direction (x) to be substantially parallel to each other, and are connected to the pixels PX. The data lines (D1 to Dm) radially extend in the display unit 500 to be connected to the pixels PX.

The gate driving circuits (SR1 to SRn) are each connected to ends of the gate lines (S1 to Sn). When the gate driving circuits (SR1 to SRn) and the emission driving circuits (ERi to ERn) are disposed in the display unit 500, a bezel formed at the outside of the display unit 500 can be substantially eliminated. On the other hand, when the gate driving circuits (SR1 to SRn) are each connected to the ends of the gate lines (S1 to Sn), a bezel is necessary at the outside of the display unit 500 so that the gate driving circuits (SR1 to SRn) are disposed therein.

On the other hand, since the gate driving circuits (SR1 to SRn) are not disposed in the display unit 500, the interval between the pixel circuits 10 can be reduced, and since more pixels PX are disposed in the display unit 500, the resolution of the display device can be improved.

Figure 14:
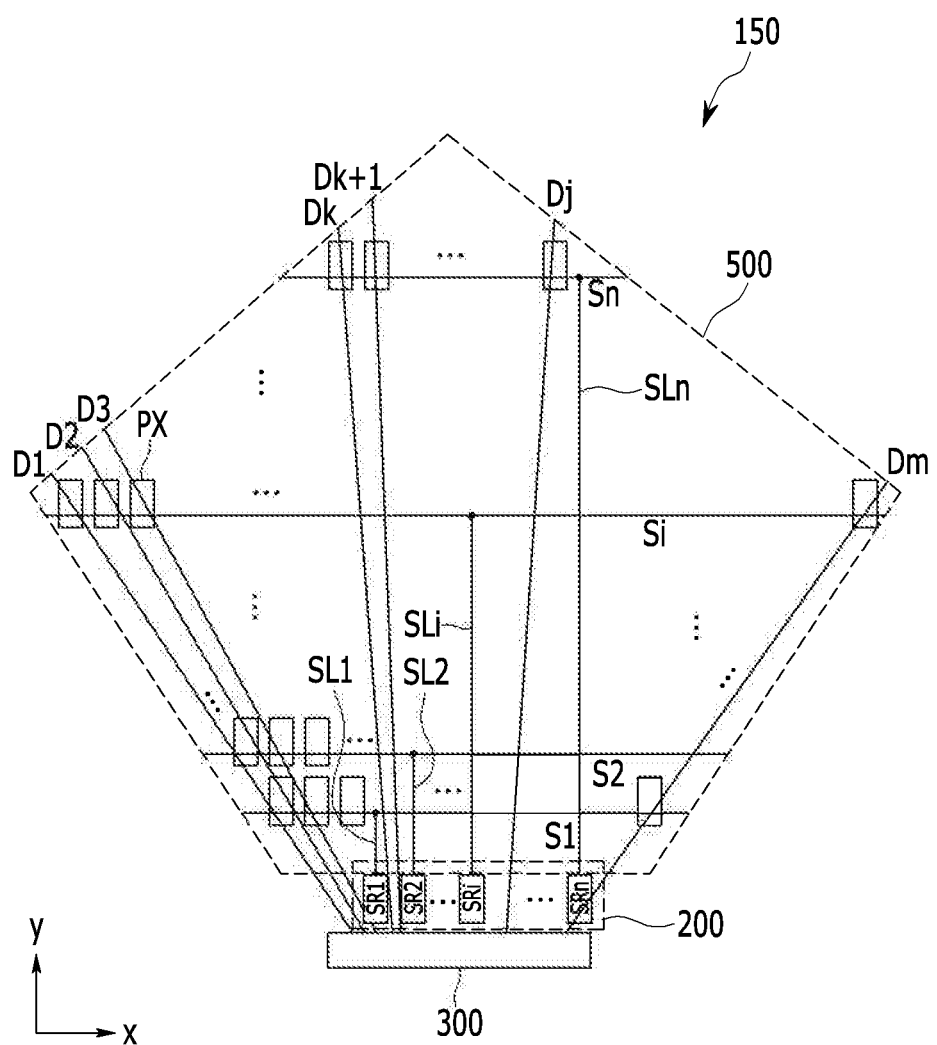
FIG. 14 illustrates a block diagram of a display device according to a further exemplary embodiment of the present disclosure.

FIG. 14 illustrates a block diagram of a display device 150 according to a further exemplary embodiment of the present disclosure. As shown in FIG. 2, a plurality of pixels PX are pixels that are driven by using gate signals and data signals.

Compared to FIG. 13, a plurality of gate driving circuits (SR1 to SRn) are not each connected to the ends of the gate lines (S1 to Sn), while they are each connected to a plurality of gate-connecting line (SL1-SLn) connected to the gate lines (S1 to Sn).

The gate-connecting lines (SL1-SLn) extend in the second direction (y) to be parallel to each other to be connected to the gate lines (S1 to Sn). The gate driving circuits (SR1 to SRn) are disposed at one side of the display unit 500 in which the data driver 300 is disposed to be connected to the gate-connecting lines (SL1-SLn). Accordingly, a bezel can be formed at only the one side in which the data driver 300 and the gate driver 200 are disposed, while bezels are not be formed in the other sides of the display unit 500.

Figure 15:
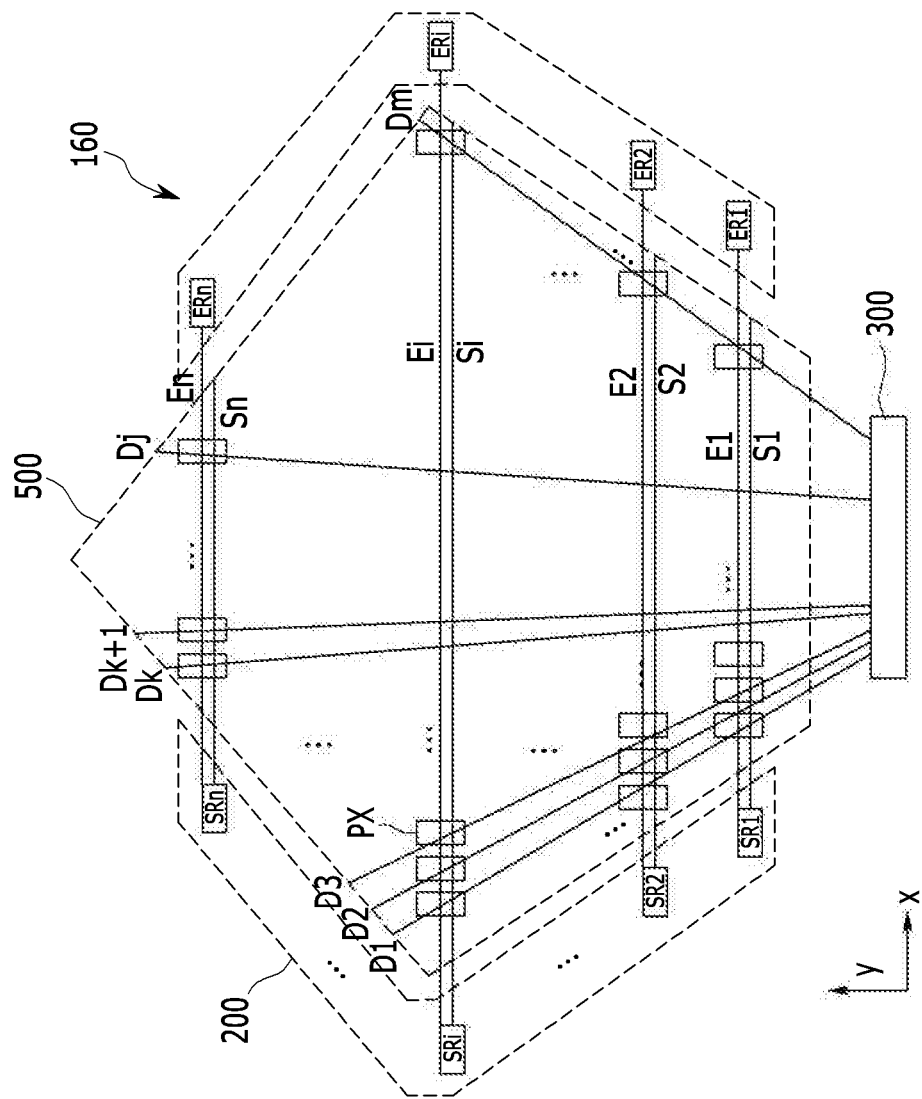
FIG. 15 illustrates a block diagram of a display device according to a further exemplary embodiment of the present disclosure.

FIG. 15 illustrates a block diagram of a display device 160 according to a further exemplary embodiment of the present disclosure. As shown in FIG. 8, a plurality of pixels PX are pixels that are driven by using gate signals, data signals, and emission signals.

Compared to FIG. 13, a plurality of emission signal lines (E1 to En) and an emission driver 400 are added. The emission signal lines (E1 to En) extend in the first direction (x) to be substantially parallel to each other to be connected to the pixels PX. The emission driver 400 includes the emission driving circuits (ER1 to ERn), and the emission driving circuits (ER1 to ERn) are connected to ends of the emission signal lines (E1 to En). When the gate driving circuits (SR1 to SRn) are disposed at one side of the display unit 500 to be connected to the gate lines (S1 to Sn), the emission driving circuits (ER1 to ERn) can be disposed at the other side of the display unit 500 to be connected to the emission signal lines (E1 to En).

Figure 16:
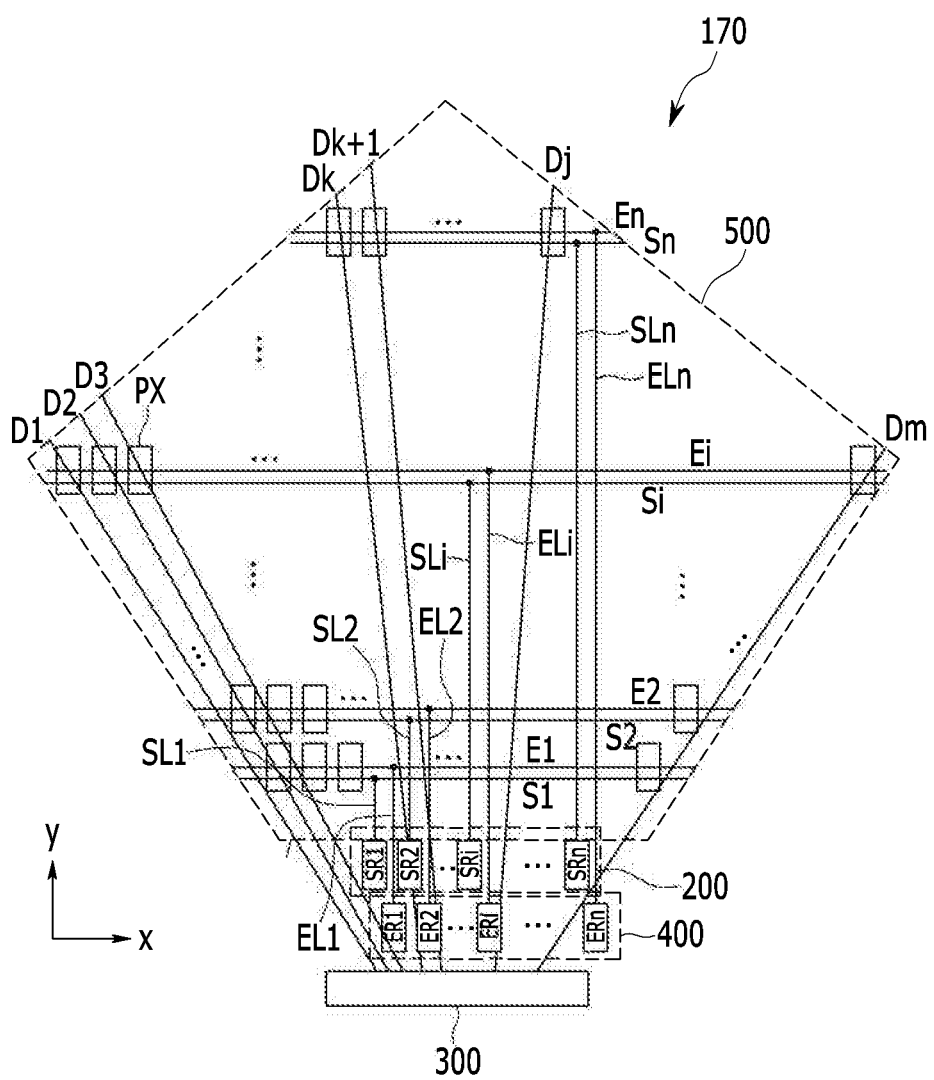
FIG. 16 illustrates a block diagram of a display device according to a further exemplary embodiment of the present disclosure.

FIG. 16 illustrates a block diagram of a display device 170 according to a further exemplary embodiment of the present disclosure. As shown in FIG. 8, a plurality of pixels PX are pixels that are driven by using gate signals, data signals, and emission signals.

Compared to FIG. 14, a plurality of emission signal lines (E1 to En), a plurality of emission-connecting lines (EL1 to ELn), and an emission driver 400 are added.

The emission-connecting lines (EL1 to ELn) extend in the second direction (y) to be parallel to each other to be the emission signal lines (E1 to En). The emission driving circuits (ER1 to ERn) are disposed at one side of the display unit 500 in which the data driver 300 is disposed, and are connected to the emission-connecting lines (EL1 to ELn). For example, the gate driving circuits (SR1 to SRn), the emission driving circuits (ER1 to ERn), and the data driver 300 are disposed at the one side of the display unit 500. Accordingly, a bezel is formed in only the one side in which the gate driving circuits (SR1 to SRn), the emission driving circuits (ER1 to ERn), and the data driver 300 are disposed, while bezels are not be formed in the other sides of the display unit 500.

Display devices of exemplary embodiments in which a plurality of data lines (D1 to Dm) are not radially disposed and in which a plurality of gate driving circuits (SR1 to SRn) and a plurality of emission driving circuits (ER1 to Ern) are disposed in the display unit 500 will now be described with reference to FIGS. 17 and 18. Compared to the display device described in FIGS. 1 to 7, differences will be mainly described.

Figure 17:
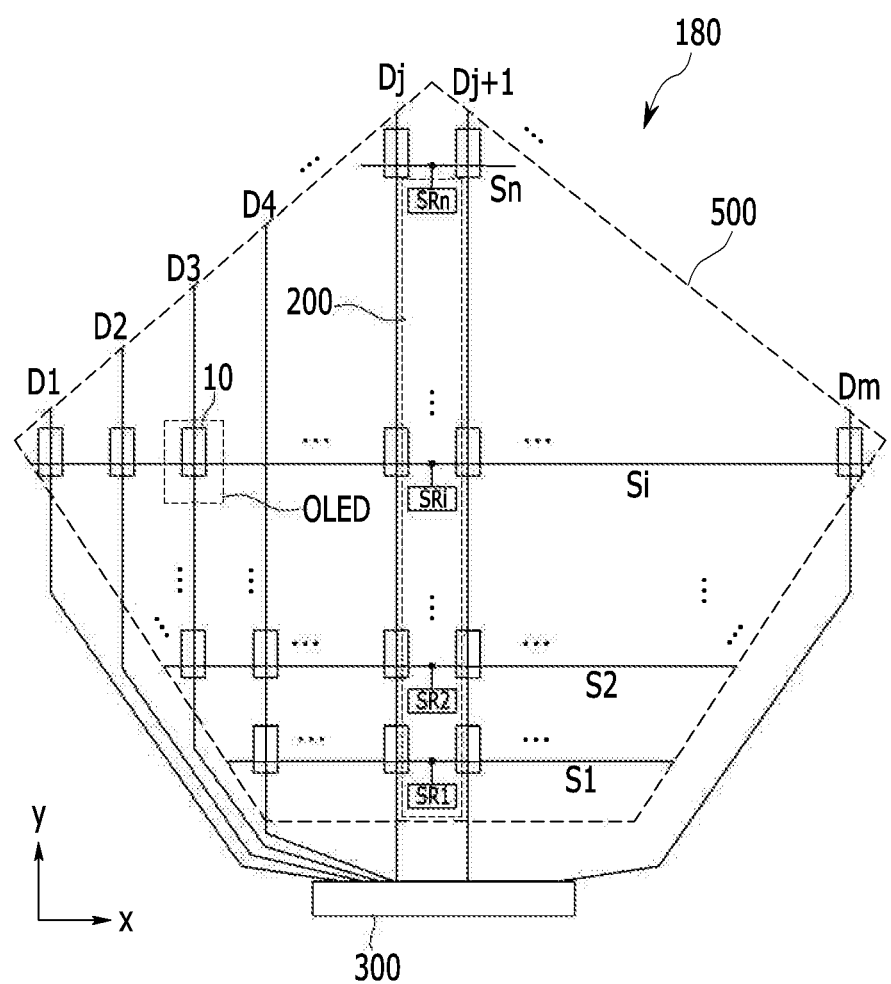
FIG. 17 illustrates a block diagram of a display device according to a further exemplary embodiment of the present disclosure.

FIG. 17 illustrates a block diagram of a display device 180 according to a further exemplary embodiment of the present disclosure. As shown in FIG. 2, a plurality of pixels PX are pixels that are driven by using gate signals and data signals.

Referring to FIG. 17, a plurality of data lines (D1 to Dm) extend in the second direction (y) in the display unit 500 to be parallel to each other to be connected to the pixels PX. When the display unit 500 is not formed in a quadrangular shape but in an atypical shape, some of the data lines (D1 to Dm) can extend along the periphery of the display unit 500 and then can extend in the second direction (y) in the display unit 500.

Since a structure in which the gate driving circuits (SR1 to SRn) are disposed in the display unit 500 and a structure of the pixels for the display unit 500 are the same as that described in FIGS. 1 to 4, a detailed description thereof will be omitted.

Figure 18:
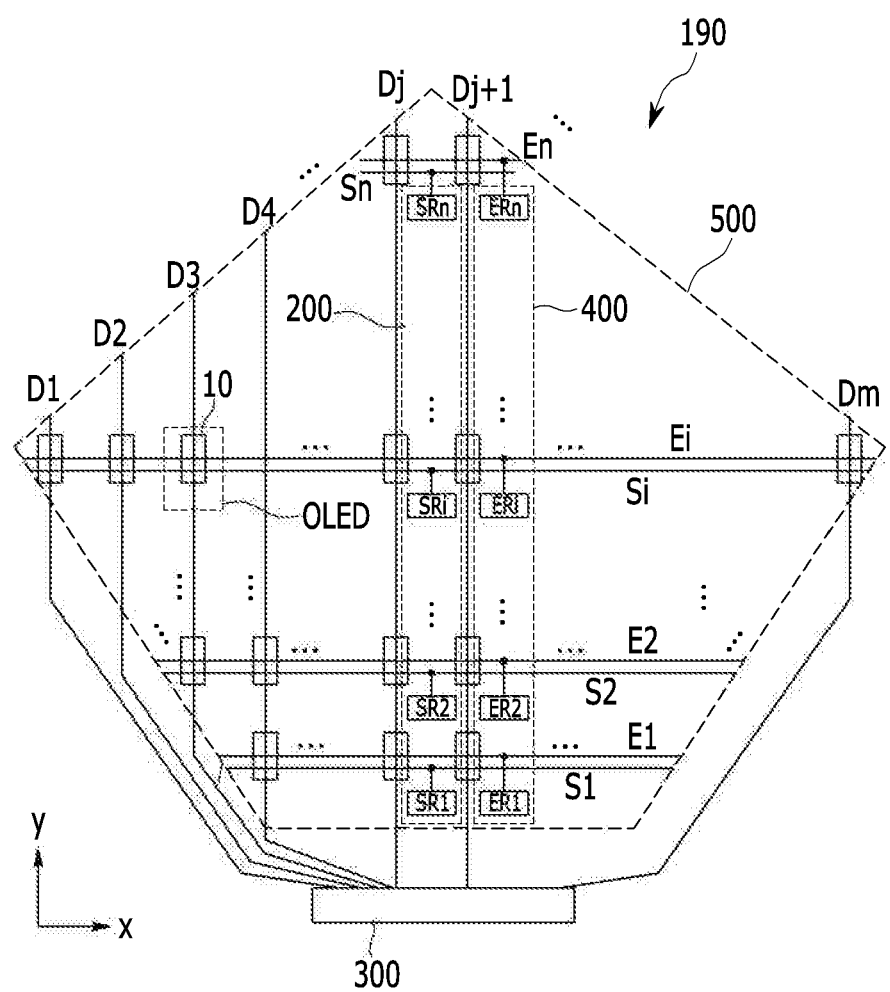
FIG. 18 illustrates a block diagram of a display device according to a further exemplary embodiment of the present disclosure.

FIG. 18 illustrates a block diagram of a display device 190 according to a further exemplary embodiment of the present disclosure. As shown in FIG. 8, a plurality of pixels PX are pixels that are driven by using gate signals, data signals, and emission signals.

Compared to FIG. 17, a plurality of emission signal lines (E1 to En) and an emission driver 400 are added. A plurality of emission signal lines (E1 to En) extend in the first direction (x) in which a plurality of gate lines (S1 to Sn) extend, and are connected to the pixels PX. Since a structure in which the gate driving circuits (SR1 to SRn) are disposed in the display unit 500 is the same as those described in FIGS. 5 to 7, a detailed description thereof will be omitted.

Figure 19:
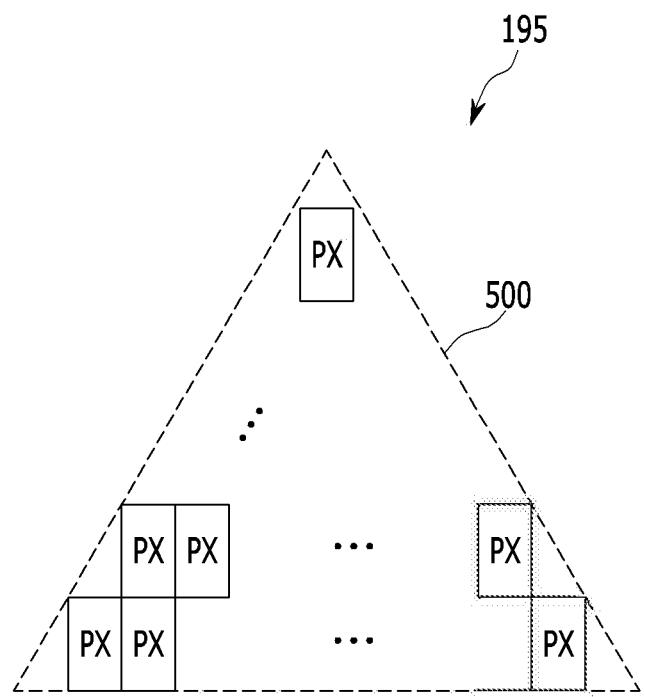
FIGS. 19 and 20 each illustrates an exemplary block diagram of a display area of a free shape display device.
Figure 20:
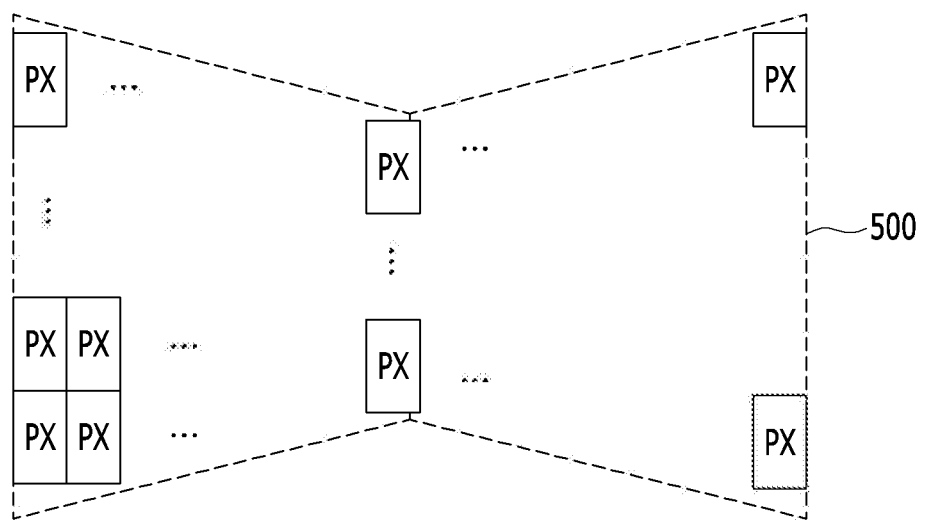

FIGS. 19 and 20 each illustrates an exemplary block diagram of a display area of a free shape display device 195.

Referring to FIGS. 19 and 20, a display unit 500 can be formed in a triangular shape as in FIG. 19, or can be formed in a ribbon shape as in FIG. 20. In addition, the display unit 500 can be formed in various polygonal shapes such as a square, a pentagon, a hexagon, a heptagon, an octagon, or the like. Further, the display unit 500 can be formed in a round shape such as a circle, an oval, or the like. Further, the display unit 500 can be formed in an atypical specific object shape including curved edges and straight edges. For example, the display unit 500 can be formed in a crown-shaped structure, a cup-shaped structure, or a pinwheel-shaped structure.

As such, at least one of a structure in which the data lines (D1 to Dm) are radially disposed in the display unit 500 formed in various shapes and a structure in which the gate driver 200 and the emission driver 400 are disposed in the display unit 500 can be applied.

The accompanying drawings and the detailed description of the disclosure are only illustrative, and are used for the purpose of describing the present disclosure but are not used to limit the meanings or scope of the present disclosure described in the claims. Therefore, those skilled in the art will understand that various modifications and other equivalent embodiments of the present disclosure are possible. Consequently, the true technical protective scope of the present disclosure must be determined based on the technical spirit of the appended claims.

What is claimed is:

1. A display device comprising:
   a display area including a plurality of pixel circuits arranged in a first direction and a second direction crossing the first direction;
   a plurality of gate lines extending in the first direction and electrically connected to the pixel circuits;
   a plurality of data lines connected to the pixel circuits; and
   a gate driver electrically connected to the gate lines and disposed between adjacent two data lines in the display area,
   wherein each of the pixel circuits includes:
      a driving transistor disposed over a substrate;
      a first organic layer disposed over the driving transistor;
      a second organic layer disposed over the first organic layer, wherein the first and second organic layers have a contact hole formed therethrough; and
      an OLED connected to the driving transistor through the contact hole, and
   wherein the data lines are disposed between the first and second organic layers.

2. The display device of claim 1, further comprising a data driver connected to the gate driver, the plurality of data lines radially extending from the data driver.

3. The display device of claim 1, wherein the gate driver includes a plurality of gate driving circuits disposed in the display area.

4. The display device of claim 3, wherein the gate driving circuits are disposed in areas that do not overlap the pixel circuits in at least one of the first and second directions in the display area.

5. The display device of claim 4, further comprising a plurality of organic light-emitting diodes (OLEDs), wherein the pixel circuits are configured to respectively drive the OLEDs.

6. The display device of claim 5, wherein the pixel circuits are spaced apart from each other, and wherein the OLEDs are disposed adjacent to each other at a narrower interval than that between the pixel circuits.

7. The display device of claim 6, further comprising a clock wire and a power wire configured to drive the gate driving circuits, wherein the clock and power wires are disposed between the pixel circuits.

8. The display device of claim 5, further comprising:
   a plurality of emission signal lines extending in the first direction and connected to the pixel circuits; and
   an emission driver electrically connected to the emission signal lines and disposed in the display area.

9. The display device of claim 8, wherein the emission driver includes a plurality of emission driving circuits disposed in the display area.

10. The display device of claim 9, wherein the emission driving circuits are disposed in areas that do not overlap the pixel circuits in at least one of the first and second directions in the display area.

11. The display device of claim 8, further comprising a clock wire and a power wire configured to drive the emission driving circuits, wherein the clock and power wires are disposed between the pixel circuits.

12. The display device of claim 5, wherein the pixel circuits are divided into a plurality of dot circuits including adjacent pixel circuits, wherein the dot circuits are spaced apart from each other, and wherein the OLEDs are disposed adjacent to each other in a narrower interval than that between the dot circuits.

13. The display device of claim 5, wherein the pixel circuits of the dot circuit portions are disposed in a stripe shape or a honeycomb shape.

14. The display device of claim 1, further comprising a data driver connected to the gate driver and the plurality of data lines connected to the pixel circuits and radially extending from the data driver, wherein the number of the pixel circuits in each row extending in the first direction is different from an adjacent row.

15. The display device of claim 14, wherein the number of the pixel circuits of each column arranged in the second direction is different from that of an adjacent column.

16. The display device of claim 15, wherein the number of the data lines is equal to or greater than one of the maximum number of the pixel circuits arranged in the first direction and the maximum number of the pixel circuits arranged in the second direction.

17. A display device comprising:
   a display area including a plurality of pixels arranged in a first direction and a second direction crossing the first direction;
   a plurality of gate lines extending in the first direction and electrically connected to the pixels;
   a gate driver electrically connected to the gate lines and disposed in the display area;
   a data driver connected to the gate driver; and a plurality of data lines connected to the pixels and radially extending from the data driver, wherein the gate driver disposed between adjacent two data lines, wherein the pixels include:
- a plurality of organic light-emitting diodes (OLEDs); and
- a plurality of pixel circuits configured to respectively drive the OLEDs, wherein each of the pixel circuits includes:
- a driving transistor disposed over a substrate;
- a first organic layer disposed over the driving transistor; and
- a second organic layer disposed over the first organic layer, wherein the first and second organic layers have a contact hole formed therethrough, wherein the each OLED is respectively connected to the driving transistor through the contact hole, and wherein the data lines are disposed between the first and second organic layers.

18. The display device of claim 17, wherein the number of the pixels of each row arranged in the first direction is different from that of adjacent row.

19. The display device of claim 17, wherein the number of the data lines is equal to or greater than one of the maximum number of the pixels arranged in the first direction and the maximum number of the pixels arranged in the second direction.

20. The display device of claim 17, further comprising a plurality of gate driving circuits electrically connected to opposing ends of the gate lines.

21. The display device of claim 20, further comprising:
- a plurality of emission signal lines extending in the first direction and electrically connected to the pixels; and
- a plurality of emission driving circuits electrically connected to opposing ends of the emission signal lines.

22. The display device of claim 17, further comprising:
- a plurality of gate-connecting lines electrically connected to the gate lines; and
- a plurality of gate driving circuits disposed at one side of the display area and electrically connected to the gate-connecting lines.

23. The display device of claim 22, further comprising:
- a plurality of emission signal lines extending in the first direction and electrically connected to the pixels;
- a plurality of emission-connecting lines electrically connected to the emission signal lines; and
- a plurality of emission driving circuits disposed at one side of the display area and electrically connected to the emission-connecting lines.

24. A display device comprising:
- a display area including a plurality of first pixel circuits arranged in a first direction and a plurality of second pixel circuits arranged in a second direction crossing the first direction;
- a plurality of gate lines extending in the first direction and electrically connected to the first and second pixel circuits;
- a gate driver electrically connected to the gate lines and disposed in the display area; and
- a data driver formed in a non-display area adjacent to the display area; and
- a plurality of data lines radially extending from the data driver and electrically connected to the first and second pixel circuits, wherein the gate driver disposed between adjacent two data lines, wherein each of the first and second pixel circuits includes:
- a driving transistor disposed over a substrate;
- a first organic layer disposed over the driving transistor;
- a second organic layer disposed over the first organic layer, wherein the first and second organic layers have a contact hole formed therethrough; and
- an OLED connected to the driving transistor through the contact hole, and wherein the data lines are disposed between the first and second organic layers.

25. The display device of claim 24, wherein the display area including the gate driver, the first and second pixel circuits, gate lines and data lines is symmetrical with respect to a center line of the display area.

26. The display device of claim 24, wherein the display area has a non-quadrangular shape.

27. The display device of claim 24, wherein the gate driver overlaps the display area in a plan view.

* * * * *